US009117814B2

(12) United States Patent
Yamamichi et al.

(10) Patent No.: US 9,117,814 B2
(45) Date of Patent: Aug. 25, 2015

(54) SEMICONDUCTOR DEVICE

(71) Applicant: Renesas Electronics Corporation, Kawasaki-shi, Kanagawa (JP)

(72) Inventors: Shintaro Yamamichi, Kanagawa (JP); Manabu Okamoto, Kanagawa (JP); Hirokazu Honda, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/284,447

(22) Filed: May 22, 2014

(65) Prior Publication Data

US 2014/0361410 A1 Dec. 11, 2014

(30) Foreign Application Priority Data

Jun. 6, 2013 (JP) ................. 2013-120013

(51) Int. Cl.
*H01L 23/02* (2006.01)
*H01L 23/06* (2006.01)
*H01L 23/04* (2006.01)
*H01L 21/44* (2006.01)
(Continued)

(52) U.S. Cl.
CPC ........ *H01L 23/49838* (2013.01); *H01L 21/563* (2013.01); *H01L 23/3135* (2013.01); *H01L 23/481* (2013.01); *H01L 23/50* (2013.01); *H01L 24/97* (2013.01); *H01L 25/0657* (2013.01); *H01L 25/50* (2013.01); *H01L 23/12* (2013.01); *H01L 23/367* (2013.01); *H01L 23/49816* (2013.01); *H01L 23/49822* (2013.01); *H01L 2224/14181* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/73253* (2013.01); *H01L 2224/97* (2013.01); *H01L 2225/06513* (2013.01); *H01L 2225/06517* (2013.01); *H01L 2225/06541* (2013.01); *H01L 2225/06555* (2013.01); *H01L 2924/15311* (2013.01); *H01L 2924/16251* (2013.01)

(58) Field of Classification Search
CPC ............ H01L 23/49838; H01L 23/481; H01L 2924/01079; H01L 2224/48091; H01L 23/5226
USPC .......... 438/106, 107, 109, 118, 119; 257/678, 257/684, 698, 707, 723, 734, 77
See application file for complete search history.

(56) References Cited

U.S. PATENT DOCUMENTS 7,247,518 B2 * 7/2007 Shibata ......................... 438/108
7,915,080 B2 * 3/2011 Takahashi et al. ............. 438/108
8,823,162 B2 * 9/2014 Foster et al. .................. 257/698

FOREIGN PATENT DOCUMENTS

JP 2011-243724 A 12/2011

*Primary Examiner* — Hsien Ming Lee
(74) *Attorney, Agent, or Firm* — Miles & Stockbridge P.C.

(57) ABSTRACT

This invention prevents a substrate of a semiconductor chip that has through-silicon vias collectively arranged in a specific area thereof from becoming cracked. When a direction in parallel with a long side of a first semiconductor chip is defined as a row direction and a direction perpendicular to the long side of the first semiconductor chip is defined as a column direction, each one of the first through-silicon vias is arranged on any one of grid points arranged in m rows and n columns (m>n). In addition, as viewed in a cross section taken along a short side of the first semiconductor chip, the center of a through-silicon via area, which is defined by coupling the outermost grid points arranged in m rows and n columns, is off center of the short side of the first semiconductor chip in a first direction.

13 Claims, 26 Drawing Sheets

(51) Int. Cl.
*H01L 23/498* (2006.01)
*H01L 23/48* (2006.01)
*H01L 23/31* (2006.01)
*H01L 23/50* (2006.01)
*H01L 21/56* (2006.01)
*H01L 25/065* (2006.01)
*H01L 23/00* (2006.01)
*H01L 25/00* (2006.01)
*H01L 23/12* (2006.01)
*H01L 23/367* (2006.01)

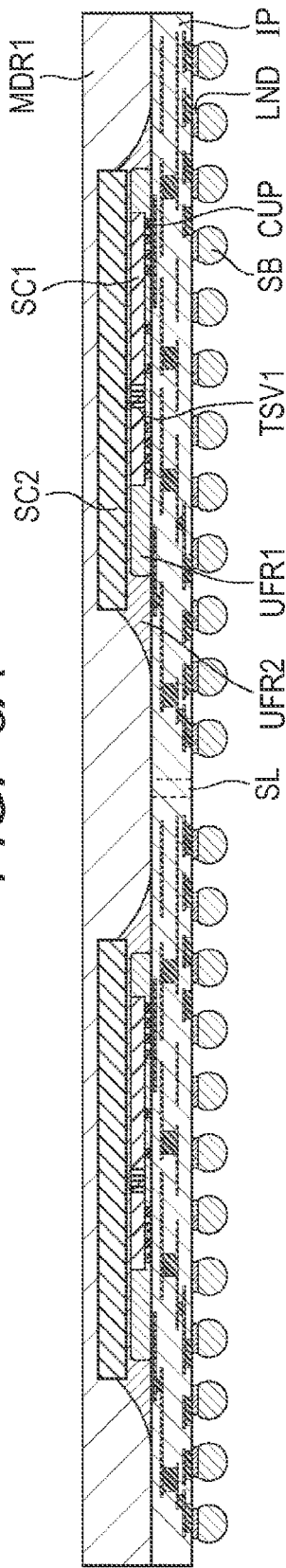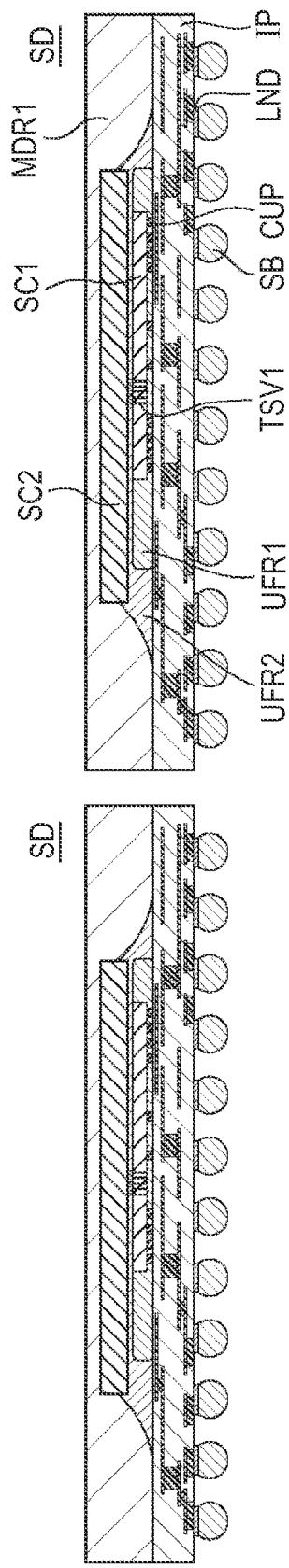

SEMICONDUCTOR DEVICE

CROSS-REFERENCE TO RELATED APPLICATIONS

The disclosure of Japanese Patent Application No. 2013-120013 filed on Jun. 6, 2013 including the specification, drawings and abstract is incorporated herein by reference in its entirety.

BACKGROUND

This invention relates to semiconductor devices, and for example, is a technique applicable to a semiconductor device in which a first semiconductor chip and a second semiconductor chip are stacked on a wiring board.

One of the methods for coupling a semiconductor chip to another semiconductor chip employs through-silicon vias. Through-silicon vias pass through a substrate of a semiconductor chip in the thickness direction. For example, Japanese Unexamined Patent Publication No. 2011-243724 discloses a method including stacking memory chips, each having through-silicon vias formed therein and coupling these memory chips using the through-silicon vias.

In this publication, the lowermost memory chip is coupled to a wiring board through solder bumps. Around the lowermost memory chip, a frame-like metal material member is provided so as to enclose the memory chip. In addition, a metal substrate is mounted over the uppermost memory chip with an adhesive member therebetween.

SUMMARY

In recent years, collective formation of the through-silicon vias within a specific area of a semiconductor chip has been studied. The inventors of this invention have concluded that in the substrate the area where the through-silicon vias are collectively formed could have lower strength than the other area. In this case, if stress is applied onto the substrate of the semiconductor chip, a crack may appear in the substrate. The other problems and novel features of the present invention will become apparent from the following description in the present specification and the accompanying drawings.

According to an embodiment, a first rectangular semiconductor chip is mounted over a first surface of a wiring board, and a second semiconductor chip is disposed over the first semiconductor chip. The second semiconductor chip is electrically coupled to first through-silicon vias of the first semiconductor chip. When a direction in parallel with a long side of the first semiconductor chip is defined as a row direction and a direction perpendicular to the long side of the first semiconductor chip is defined as a column direction, each one of the first through-silicon vias is arranged on any one of grid points arranged in m rows and n columns (m>n). As viewed in a cross section taken along a short side of the first semiconductor chip, the center of a through-silicon via area, which is defined by coupling the outermost grid points arranged in m rows and n columns, is off center of the short side of the first semiconductor chip in a first direction.

Even if the through-silicon vias are collectively formed in the through-silicon via area of the semiconductor chip substrate, the substrate according to the embodiment is prevented from being cracked.

BRIEF DESCRIPTION OF THE DRAWINGS

FIGS. 8A and 8B are cross-sectional views to illustrate the method for manufacturing the semiconductor device.

DETAILED DESCRIPTION

With reference to the accompanying drawings, embodiments will be described below. Note that in all drawings like components are denoted by like numerals and therefore the explanations thereof will not be reiterated if not necessary.

<First Embodiment>

Figure 1:
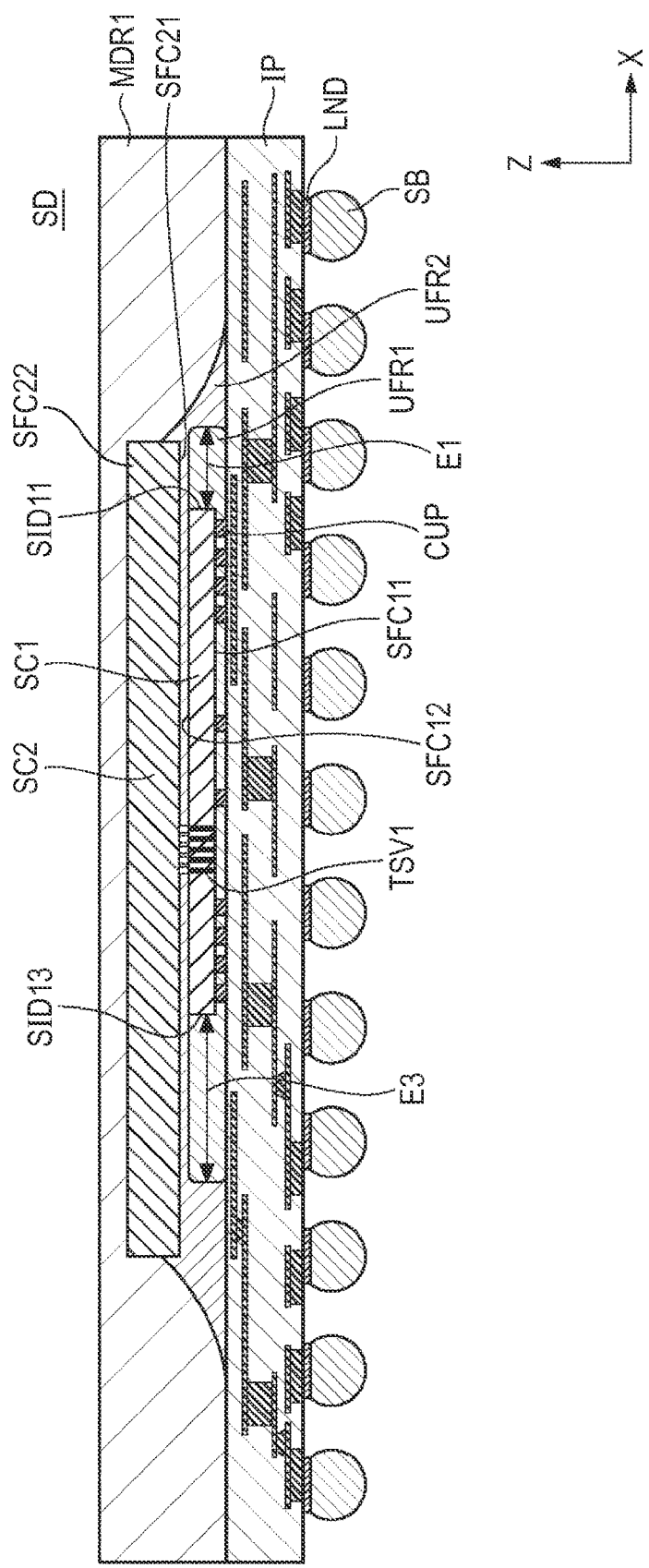
FIG. 1 is a cross-sectional view showing the configuration of a semiconductor device according to the first embodiment.
Figure 2:
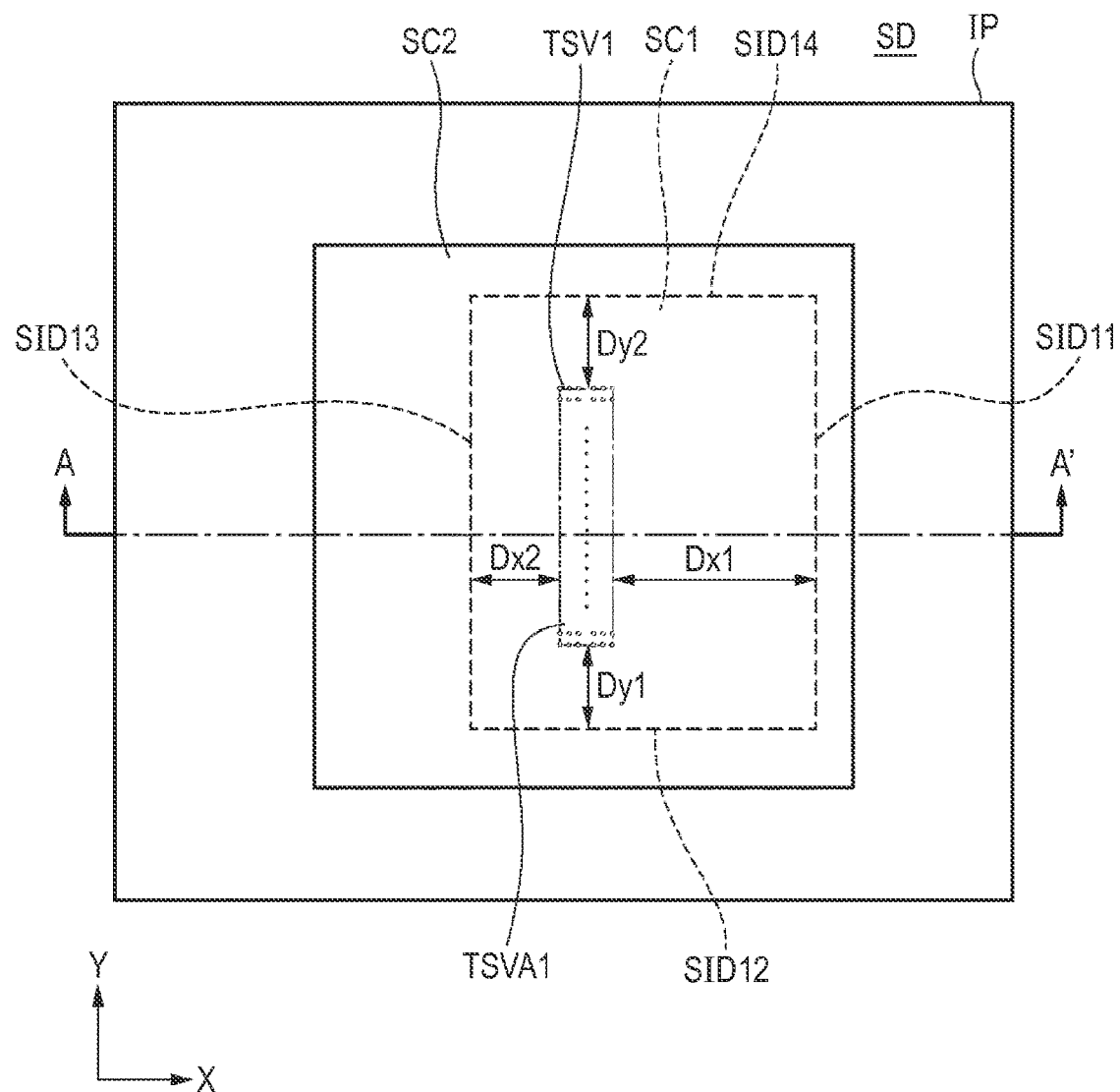
FIG. 2 schematically illustrates the relative positions of a wiring board, a first semiconductor chip, and a second semiconductor chip included in the semiconductor device.

FIG. 1 is a cross-sectional view showing the configuration of a semiconductor device SD according to the first embodiment. FIG. 2 schematically illustrates the relative positions of a wiring board IP, a first semiconductor chip SC1, and a second semiconductor chip SC2 included in the semiconductor device SD. FIG. 1 corresponds to across section taken along A-A' in FIG. 2. The semiconductor device SD according to the first embodiment includes a wiring board IP, a first semiconductor chip SC1, and a second semiconductor chip SC2.

The first semiconductor chip SC1 is mounted over a first surface of the wiring board IP and is rectangular in plan. The first semiconductor chip SC1 has an element formation surface SFC11 facing the first surface of the wiring board IP. The first semiconductor chip SC1 also has a plurality of first through-silicon vias TSV1.

The second semiconductor chip SC2 is disposed over the first semiconductor chip SC1 and is electrically coupled to the first through-silicon vias TSV1 of the first semiconductor chip SC1.

When a direction in parallel with long sides SID11, SID13 of the first semiconductor chip SC1 (i.e., Y-direction in FIG. 2) is defined as a row direction and a direction perpendicular to the long sides SID11, SID13 (i.e., X-direction in FIG. 2) is defined as a column direction, each one of the first through-silicon vias TSV1 is arranged on any one of the grid points arranged in m rows and n columns (m>n). In addition, as viewed in a cross section in parallel with short sides SID12, SID14 of the first semiconductor chip SC1 (e.g., cross section taken along A-A' in FIG. 2: FIG. 1), the center of a through-silicon via area TSVA1, which is defined by coupling the outermost grid points arranged in m rows and n columns, is off the centers of the short sides SID12, SID14 of the first semiconductor chip SC1 in a first direction (i.e., X-direction in FIGS. 1 and 2).

In other words, when n is an odd number, the first through-silicon via TSV1 positioned in (n+1)/2nd in the column direction is deviated from the center of the short sides SID12, SID14 of the first semiconductor chip SC1 in the first direction. On the contrary, when n is an even number, the center of an area between the first through-silicon via TSV1 positioned in n/2nd and the first through-silicon via TSV1 positioned in (n+2)/2nd in the column direction is deviated from the centers of the short sides SID12, SID14 of the first semiconductor chip in the first direction.

The configuration of the semiconductor device SD will be described in detail below.

Referring to FIG. 1, the configuration of the semiconductor device SD will be described. The wiring board IP is, for example, a resin interposer having wiring layers on at least both sides. The wiring board IP may have two wiring layers or four or more wiring layers. The thickness of the wiring board IP is, for example, from 100 μm to 300 μm. However, the wiring board IP can be thicker or thinner than those thicknesses. The wiring over a first surface (i.e., a side where the first semiconductor chip SC1 is mounted) of the wiring board IP includes electrodes IEL (which will be described later by referring to FIG. 3). The electrodes IEL are electrically coupled to the first semiconductor chip SC1.

The wiring board IP has a wiring layer on a second surface, which is the opposite side of the first surface, and electrodes LND are disposed over the wiring layer. The electrodes LND are coupled to the electrodes IEL through at least coupling members provided in the wiring board IP (e.g., a conductive layer provided in a through hole). External connection terminals SB are provided over the electrodes LND. The external connection terminals SB are used to attach the semiconductor device SD to a circuit board (e.g., a motherboard). The external connection terminals SB are, for example, solder balls. The electrodes LND and external connection terminals SB are arranged at least along the edges of the wiring board IP. However, the electrodes LND and external connection terminals SB can be additionally disposed at the center of the wiring board IP. In this case, the electrodes LND and external connection terminals SB may be provided across the entire surface of the wiring board IP, or the group of the external connection terminals SB arranged at the center of the wiring board IP and the group of the external connection terminals SB arranged at the edges of the wiring board IP may have a space therebetween, which is larger than a distance between the grid points of the respective groups.

As described above, the first semiconductor chip SC1 is coupled to the electrodes IEL on the wiring board IP. In the example shown in the drawings, the first semiconductor chip SC1 is coupled to the electrodes IEL via connection terminals CUP. The connection terminals CUP are, for example, conductor posts made of metal, such as Cu. However, solder bumps can be also used as the connection terminals.

The first semiconductor chip SC1 has a thickness thinner than the wiring board IP or, for example, is half the thickness of the wiring board IP or thinner. The thickness of the first semiconductor chip SC1 is, for example, 50 μm to 60 μm, but is not limited thereto.

On the element formation surface SFC11 of the first semiconductor chip SC1, at least one logic circuit is formed. This logic circuit is coupled to the second semiconductor chip SC2 via the plurality of first through-silicon vias TSV1.

The second semiconductor chip SC2 is, for example, a memory chip. The memory included in the second semiconductor chip SC2 may be a Wide I/O memory or a DDR (Double Data Rate) memory (such as DDR2 and DDR3). However, the second semiconductor chip SC2 can be a semiconductor chip with a logic circuit or a semiconductor chip having both a logic circuit and a memory circuit. The second semiconductor chip SC2 has an element formation surface SFC21 facing a back surface SFC12 of the first semiconductor chip SC1.

In addition, as viewed in plan view, the second semiconductor chip SC2 extends out further than the two long sides SID13 (a long side in the first direction) and SID11 (the other long side) of the first semiconductor chip SC1. Of the second semiconductor chip SC2, the width of the part extending out further than the long side SID13 is wider than that of the part extending out further than the long side SID11.

The space between the first semiconductor chip SC1 and the first surface of the wiring board IP is sealed with sealing resin UFR1. The space between the second semiconductor chip SC2 and the first surface of the wiring board IP is also sealed with sealing resin UFR2. Consequently, the sealing resin UFR1 is covered with the sealing resin UFR2. The sealing resin UFR1 may be a die attachment film (DAF) or may be formed by dripping liquid resin. The sealing resin UFR2 is made, for example, by dripping liquid resin. The sealing resin UFR2 can be also used to fill up the space between the first semiconductor chip SC1 and the second semiconductor chip SC2.

As viewed in plan view, the sealing resin UFR1 extends out further than the first semiconductor chip SC1. Of the sealing resin UFR1, the part extending out further than the long side SID13 has a width E3 that is wider than the width E1 of the part extending out further than the long side SID11. Accordingly, even if the second semiconductor chip SC2 deviates from the first semiconductor chip SC1 toward the long side SID13, the space between the sealing resin UFR1 and the second semiconductor chip SC2 can be prevented from becoming too large. Consequently, voids, which are likely to occur between the sealing resin UFR1 and sealing resin UFR2 when the sealing resin UFR2 is formed by dripping liquid resin, can be prevented.

As viewed in a cross section taken along a short side of the first semiconductor chip SC1, the center of the second semiconductor chip SC2 is not aligned with the center of the first semiconductor chip SC1. This arrangement may possibly cause the second semiconductor chip SC2 to tilt when the second semiconductor chip SC2 is mounted over the first semiconductor chip SC1. Therefore, making the width E3 of the extending part of the sealing resin UFR1 on the side of the long side SID13 wider than the width E1 of the extending part on the side of the long side SID11 can prevent the second semiconductor chip SC2 from tilting.

The first surface of the wiring board IP, the first semiconductor chip SC1, the sealing resin UFR2, and the second semiconductor chip SC2 are sealed with sealing resin MDR1. In the example shown in FIG. 1, the sealing resin MDR1 has side surfaces flush with the side surfaces of the wiring board IP. However, as viewed in plan view, the side surfaces of the sealing resin MDR1 can be positioned more inwardly than the side surfaces of the wiring board IP. The sealing resin MDR1 also covers the back surface SFC22 of the second semiconductor chip SC2.

Next, FIG. 2 is referred to describe the configuration of the semiconductor device SD. The first semiconductor chip SC1 is rectangular in plan and has a long side SID11, a short side SID12, a long side SID13, and a short side SID14. The first through-silicon vias TSV1 are located in a through-silicon via area TSVA1 defined by coupling the outermost grid points arranged in m rows and n columns, and arranged on the grid points, respectively. The through-silicon via area TSVA1 is a rectangle having long sides (i.e., the row direction) in parallel with the long sides SID11, SID13 of the first semiconductor chip SC1.

In the example shown in FIG. 2, as viewed in the cross section taken along a short side of the first semiconductor chip SC1 (i.e., in X-direction in FIG. 2), the distance Dx2 from the through-silicon via area TSVA1 to the long side SID13 is shorter than the distance Dx1 from the through-silicon via area TSVA1 to the long side SID11. It is preferable that the distance Dy1 from the through-silicon via area TSVA1 to the short side SID12 is equal to the distance Dy2 from the through-silicon via area TSVA1 to the short side SID14; however, the distances Dy1 and Dy2 can be different from each other.

As viewed in the cross section taken along the short side of the first semiconductor chip SC1, the center (or center of gravity) of the first semiconductor chip SC1 is aligned with the center (or center of gravity) of the wiring board IP.

As viewed in the cross section taken along the short side of the first semiconductor chip SC1, the through-silicon via area TSVA1 is not aligned with the center of the first semiconductor chip SC1, but is aligned with the center of the second semiconductor chip SC2. That is, the center of the second semiconductor chip SC2 is not aligned with the center of the first semiconductor chip SC1. In addition, the cross section indicates that the through-silicon via area TSVA1 is aligned with the center of the wiring board IP.

Figure 3:
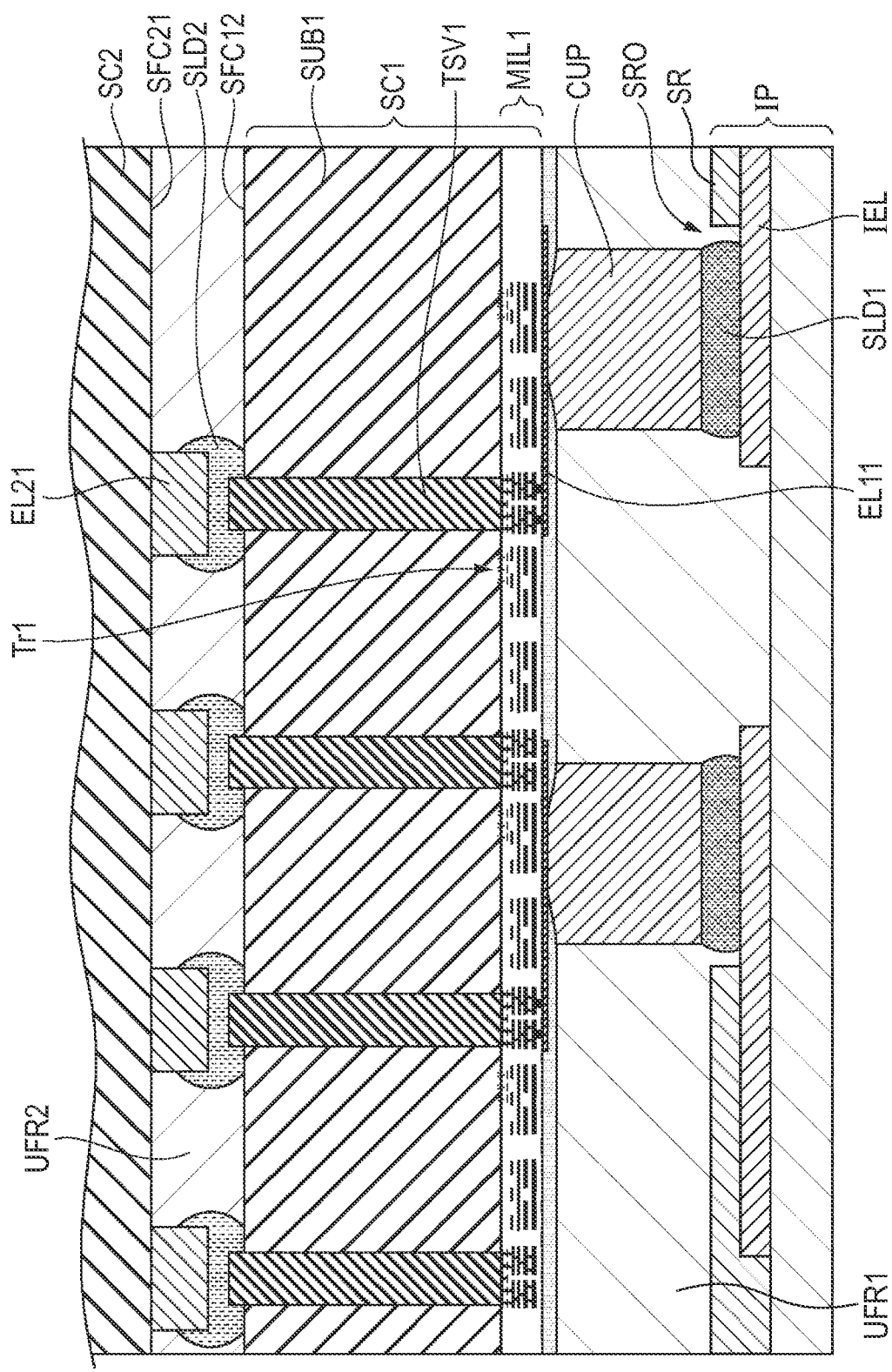
FIG. 3 is a cross-sectional view to illustrate the configuration of a part in which the first semiconductor chip is coupled to the wiring board and a part in which the first semiconductor chip is coupled to the second semiconductor chip.

FIG. 3 is a cross-sectional view to illustrate the configuration of a coupling part of the first semiconductor chip SC1 and the wiring board IP and a coupling part of the first semiconductor chip SC1 and the second semiconductor chip SC2.

The first semiconductor chip SC1 is made up with a substrate SUB1. The substrate SUB1 is a semiconductor substrate, such as a silicon substrate. Transistors Tr1 are formed over the substrate SUB1. Over the surface of the substrate SUB1 where the transistors Tr1 are formed, a multilevel interconnection layer MIL1 is formed. Various circuits of the first semiconductor chip SC1 are configured with lines in the multilevel interconnection layer MIL1 and the transistors Tr1.

First through-silicon vias TSV1 are formed in the substrate SUB1. The first through-silicon vias TSV1 are made of a conductive material, such as copper, so as to pass through the substrate SUB1. An insulating film (not shown) is formed between the first through-silicon vias TSV1 and the substrate SUB1.

Over the uppermost wiring layer of the multilevel interconnection layer MIL1, electrodes EL11 are formed. Over each electrode EL11, a connection terminal CUP, which is a conductor post, such as a Cu pillar, is formed. The connection terminal CUP is coupled to an electrode IEL on the first surface of the wiring board IP with solder SLD1 therebetween. An insulating layer SR, such as a solder resist layer, is provided over the first surface of the wiring board IP. The insulating layer SR has an opening SRO at a position overlapping with the electrode IEL. The periphery of the electrode IEL may be covered with the insulating layer SR or may be exposed from the insulating layer SR.

Some electrodes EL11 are coupled through the lines and vias in the multilevel interconnection layer MIL1 to ends of the first through-silicon vias TSV1 on the side of the element formation surface SFC11. The other ends of the first through-silicon vias TSV1 on the side of the back surface SFC12 are coupled to connection terminals EL21 of the second semiconductor chip SC2 through solder SLD2.

In the example shown in FIG. 3, the connection terminals EL21 overlap with the first through-silicon vias TSV1, respectively, as viewed in plan view. However, at least some of the connection terminals EL21 do not need to overlap with the corresponding first through-silicon vias TSV1 in plan view. In this case, at least one wiring layer is formed over the back surface SFC12 of the first semiconductor chip SC1. Through lines in the wiring layer, the connection terminals EL21 are coupled to the first through-silicon vias TSV1.

The first through-silicon vias TSV1 are arranged with a small pitch compared with the pitch between the connection terminals CUP. The connection terminals CUP arranged with a relatively large pitch can be made thicker than the first through-silicon vias TSV1. Making the connection terminals CUP thicker can enhance the mechanical reliability when the first semiconductor chip SC1 is coupled to the wiring board IP. In addition, the connection terminals CUP can be made higher. In the example shown in FIG. 3, in plan view, some of the first through-silicon vias TSV1 at least partially overlap with the connection terminals CUP. This can ease restrictions on the layout of the connection terminals CUP and the first through-silicon vias TSV1. Alternatively, the first through-silicon vias TSV1 can be designed not to overlap with any of the connection terminals CUP.

Figure 4:
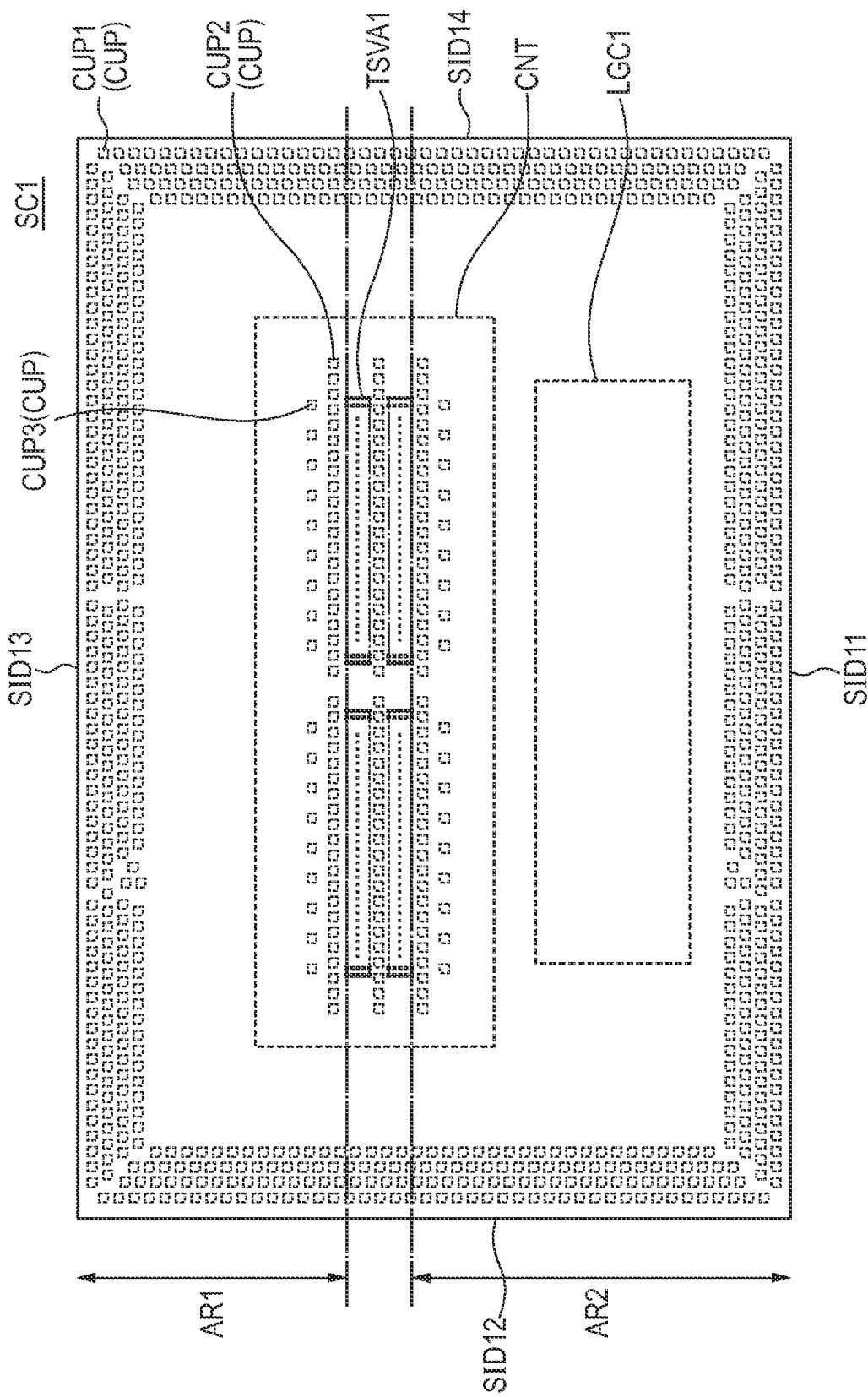
FIG. 4 is a plan view to illustrate the configuration of the first semiconductor chip.

FIG. 4 is a plan view to illustrate the configuration of the first semiconductor chip SC1. In an example shown in FIG. 4, the first semiconductor chip SC1 has a plurality of through-silicon via areas TSVA1. At least some of these first through-silicon vias TSV1 are arranged in a direction along the short side SID14 of the first semiconductor chip SC1. In a cross section taken along the short side SID12, the center of every through-silicon via area TSVA1 is off center of the short side SID12 in the same direction (first direction).

In the example shown in the drawings, the second semiconductor chip SC2 is a memory chip. The first through-silicon vias TSV1 are arranged in accordance with specifications set out in JEDEC JESD 229. Hence, four through-silicon via areas TSVA1 are arranged in two rows and two columns. The first semiconductor chip SC1, as viewed in plan view, has a control circuit formation area CNT at an area overlapping with the four through-silicon via areas TSVA1 and the surroundings. In the control circuit formation area CNT, a memory control circuit is formed to control the memory of the second semiconductor chip SC2. Among coupling paths for coupling the memory control circuit and the second semiconductor chip SC2, the coupling paths formed in the multilevel interconnection layer MIL1 of the first semiconductor chip SC1 can be made short by this configuration.

The first semiconductor chip SC1 has a first circuit formation area LGC1. A first circuit is formed in the first circuit formation area LGC1. The first circuit performs signal processing while communicating with the second semiconductor chip SC2. In the example shown in FIG. 4, if the first semiconductor chip SC1 is divided by an area, which is made by extending the through-silicon via areas TSVA1 in the direction in parallel with the long sides of the through-silicon via areas TSVA1, into a first area AR1 and a second area AR2, which is wider than the first area AR1, the first circuit formation area LGC1 is arranged in the second area AR2. In this arrangement manner, the first circuit formation area LGC1 can be made large.

In addition, some of the connection terminals CUP (i.e., connection terminals CUP1) are disposed along the four sides (long side SID11, short side SID12, long side SID13, and short side SID14) of the first semiconductor chip SC1. In the example shown in FIG. 4, the connection terminals CUP1 are disposed along the four sides of the first semiconductor chip SC1 so as to form a plurality of lines.

Some of the connection terminals CUP (i.e., connection terminals CUP2) are located between the first circuit formation area LGC1 and the through-silicon via areas TSVA1. Even if stress is applied onto the first semiconductor chip SC1, the connection terminals CUP2 fixedly provided to the wiring board IP can prevent the through-silicon via area TSVA1 from suffering warpage. Therefore, it can be prevented that the substrate SUB1 of the first semiconductor chip SC1 becomes cracked starting from the through-silicon via area TSVA1. The connection terminals CUP2 can have a larger cross-sectional area than the connection terminals CUP1. The larger cross-sectional area of the connection terminals CPU2 increases the aforementioned effects.

In the example shown in FIG. 4, the connection terminals CUP2 are disposed along the long sides of the through-silicon via areas TSVA1 arranged in two rows and two columns. The connection terminals CUP2 can be further disposed along the short sides of the through-silicon via areas TSVA1.

Furthermore, at least some of the connection terminals CUP2 can be coupled to the first through-silicon vias TSV1 through the lines and vias formed in the multilevel interconnection layer MIL1 of the first semiconductor chip SC1. In this case, the connection terminals CUP2 directly coupled to the electrodes EL11 are coupled to a power electrode or a ground electrode of the second semiconductor chip SC2.

In the example shown in FIG. 4, connection terminals CUP3 are disposed outside the connection terminals CUP2. The connection terminals CUP3 can be also coupled to the first through-silicon vias TSV1 through the lines and vias formed in the multilevel interconnection layer MIL1 of the first semiconductor chip SC1. In this case, the connection terminals CUP 3 may be used, for example, as terminals for testing the second semiconductor chip SC2.

The electrodes IEL over the wiring board IP are also arranged so as to correspond with the connection terminals CUP.

Figure 5:
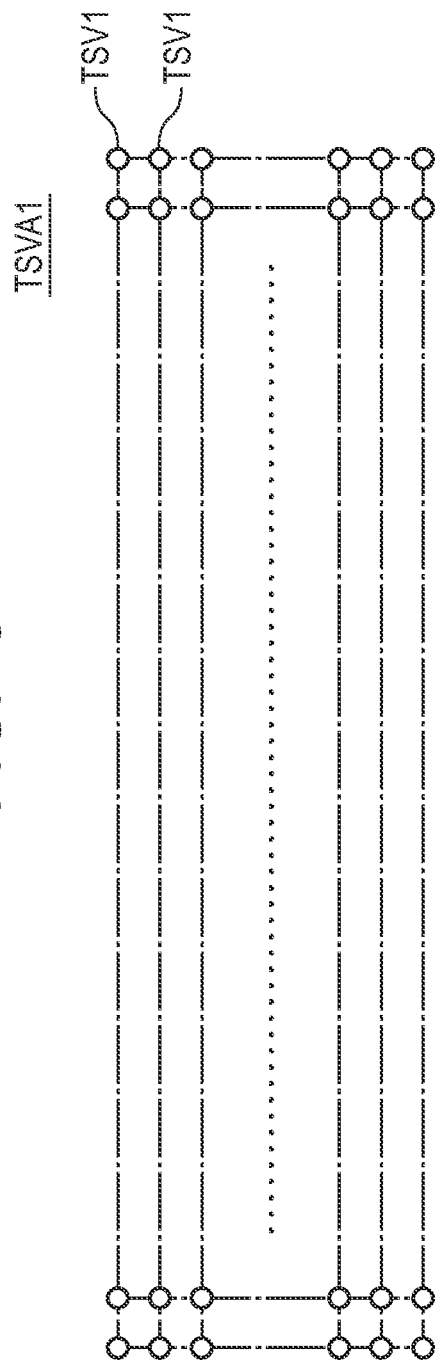
FIG. 5 illustrates an exemplary arrangement of the first through-silicon vias in a through-silicon via area.

FIG. 5 illustrates an exemplary arrangement of the first through-silicon vias TSV1 in a through-silicon via area TSVA1. As shown in FIG. 5, a plurality of first through-silicon vias TSV1 are arranged on grid points, respectively, in the through-silicon via area TSVA1. The long side of the through-silicon via area TSVA1 is, for example, ten or more times longer than the short side of the through-silicon via area TSVA1. In the grid pattern where the first through-silicon vias TSV1 are arranged, adjacent four grid points form, for example, a square, a rectangle, or a parallelogram, but the shape is not limited thereto. In addition, it is not necessary to arrange the first through-silicon vias TSV1 on all the grid points. The ratio of grid points on which the first through-silicon vias TSV1 are not arranged to all the grid points is, for example, 10% or less.

Figure 6:
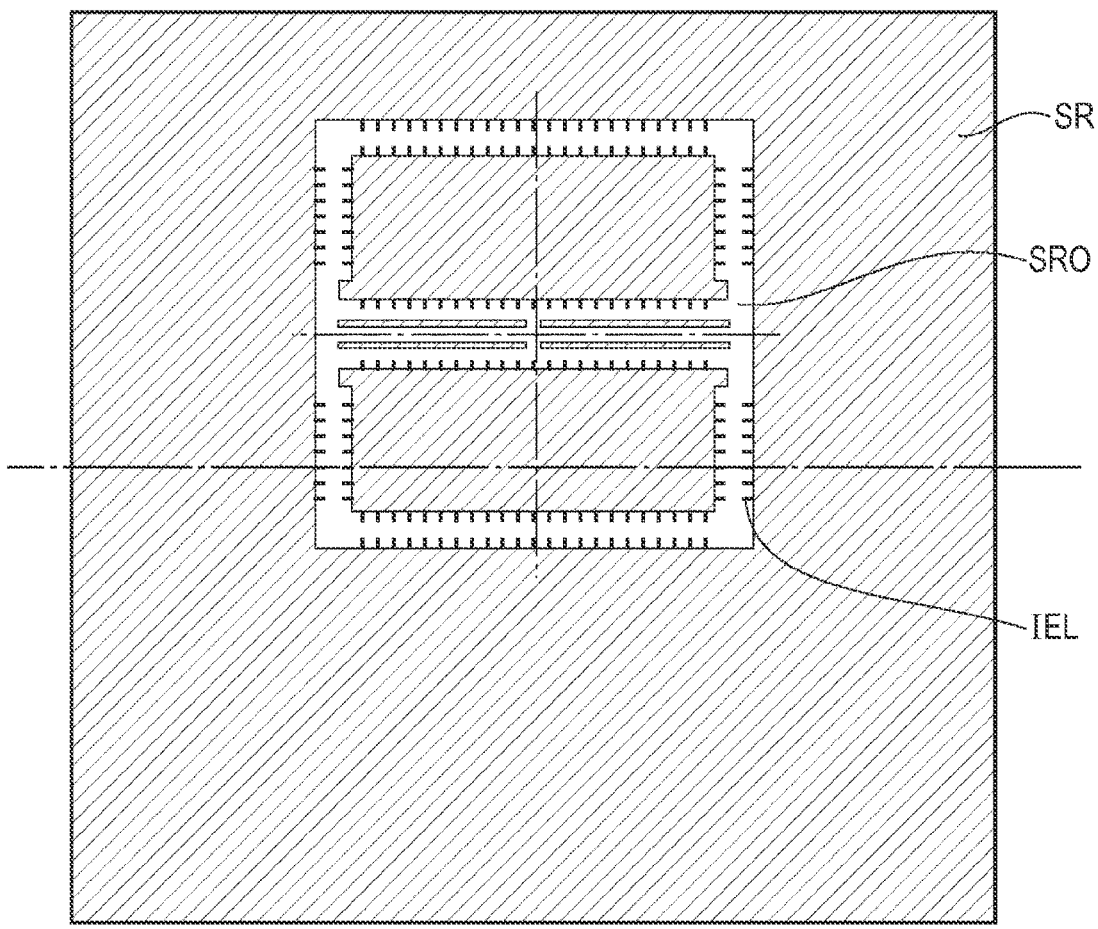
FIG. 6 illustrates an exemplary shape of an opening of the wiring board.

FIG. 6 illustrates an exemplary shape of the opening SRO of the wiring board IP. In the example shown in FIG. 6, the opening SRO is not provided for every single electrode IEL, but is provided as a common opening for plural electrodes IEL. Specifically, a first opening SRO is continuously formed along the edges of the wiring board IP so as to overlap with the electrodes IEL corresponding to the connection terminals CUP1. Then, a second opening SRO is formed at the center of the wiring board IP so as to overlap with electrodes IEL corresponding to the connection terminals CUP2 and electrodes IEL corresponding to the connection terminals CUP3. In the example shown in FIG. 6, the ends of the second opening SRO are coupled to the first opening SRO. However, the first opening SRO and second opening SRO can be separated from each other. Alternatively, the second opening SRO can be split into plural openings that are each allocated to each through-silicon via area TSVA1.

Figure 9:
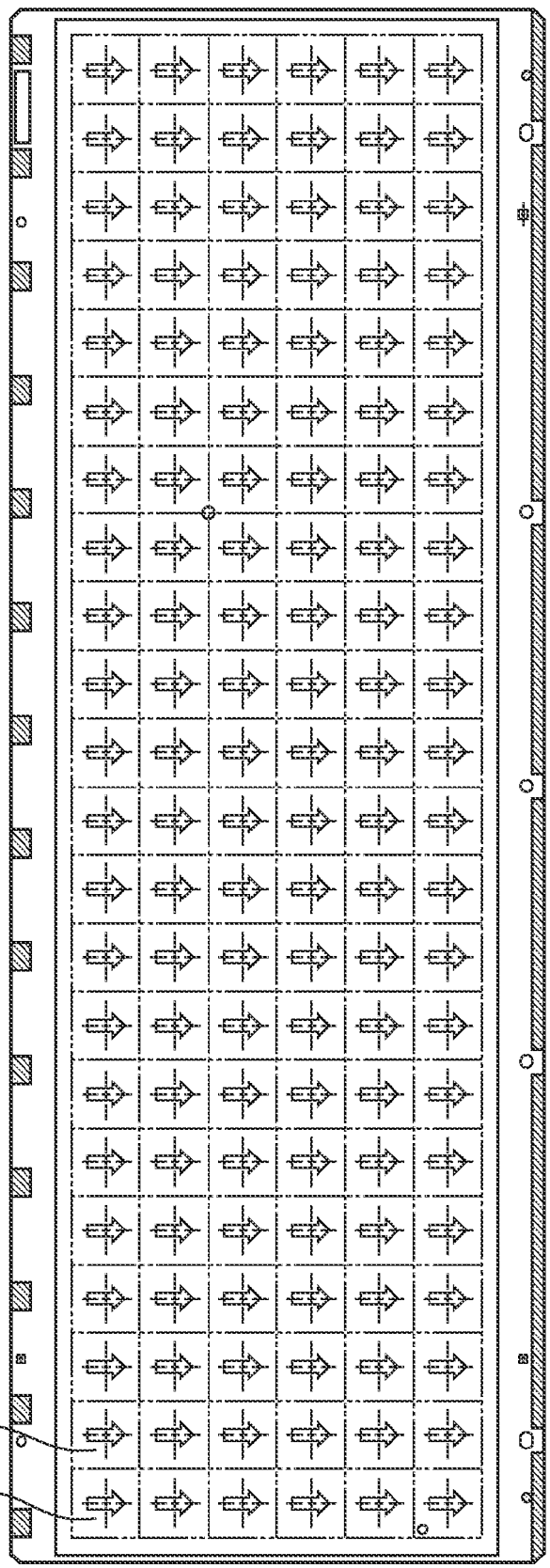
FIG. 9 is a plan view to illustrate the configuration of the wiring board.

Referring to FIGS. 7 to 9, a method for manufacturing the semiconductor device SD will be described. First, a first semiconductor chip SC1 and a second semiconductor chip SC2 are prepared. The first semiconductor chip SC1 and the second semiconductor chip SC2 are formed, for example, in the following manner.

First, an element isolation film is formed on a substrate in the form of a wafer (e.g., a substrate SUB1). With this element isolation film, element formation areas are isolated. The element isolation film is formed by, for example, an STI method, but also can be formed by a LOCOS method. Then, a gate insulating film and a gate electrode are formed in the element formation area of the substrate SUB1. The gate insulating film may be a silicon oxide film or a High-k dielectric film (e.g., a hafnium silicate film) with a dielectric constant higher than that of silicon oxide films. If the gate insulating film is a silicon oxide film, the gate electrode is made of a polysilicon film. If the gate insulating film is a High-k dielectric film, the gate electrode is made of a laminated film of a metal film (e.g., TiN) and a polysilicon film. In the case where the gate electrode is made of polysilicon, a polysilicon resistor can be formed over the element isolation film in the course of forming the gate electrode.

Next, an extension region for a source and a drain is formed in the element formation area of the substrate. Then, a sidewall is formed on the sides of the gate electrode. Then, an impurity region to be a source and a drain is formed in the element formation area of the substrate. Thus, a transistor (e.g., a transistor TR1) is formed over the substrate.

Subsequently, a multilevel interconnection layer (e.g., multilevel interconnection layer MIL1) is formed over the element isolation film and transistor. An electrode (e.g., electrode EL11) is formed over the uppermost layer of the multilevel interconnection layer. Then, a protection insulating film (passivation film) is formed over the multilevel interconnection layer. An opening is formed in the protection insulating film over the electrode.

In the course of forming the multilevel interconnection layer, a capacitative element, which serves as a memory cell, is also formed for the second semiconductor chip SC2.

A connection terminal CUP is formed over the electrode EL11 of the first semiconductor chip SC1. If the connection terminal CUP is a conductor post, the connection terminal CUP is formed by, for example, plating. Over the connection terminal CUP, a solder layer is formed.

Then, first through-silicon vias TSV1 are formed in the first semiconductor chip SC1 at any point in time in the aforementioned steps. For example, the first through-silicon vias TSV1 may be formed before the transistor Tr1 has been formed or after the electrode EL11 and protection insulating film have been formed. Alternatively, the first through-silicon vias TSV1 can be formed after the transistor Tr1 and multilevel interconnection layer have been partially formed. In this case, ends of the first through-silicon vias TSV1 on the side of the element formation surface SFC11 are coupled to any layer of the multilevel interconnection layer. In addition, at any point in time, electrodes can be formed over the back surface SFC12 of the first semiconductor chip SC1 to be coupled to the first through-silicon vias TSV1.

Subsequently, the wafer is cut into semiconductor chips.

Wiring boards IP as shown in FIG. 9 are prepared. FIG. 9 shows that a plurality of wiring boards IP coupled to each other with scribe regions SL (see FIGS. 7A, 7B, 7C and other drawings).

Figure 7A:
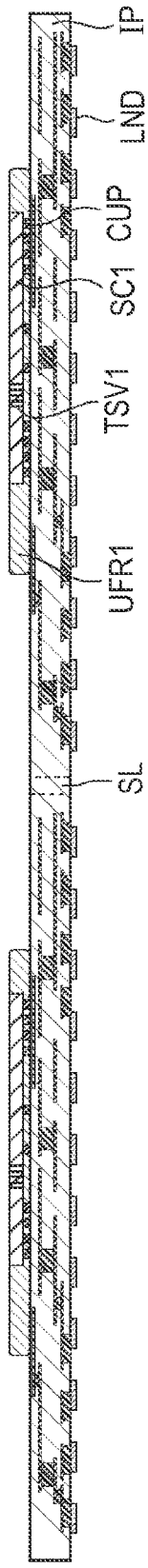
FIGS. 7A, 7B, and 7C are cross-sectional views to illustrate a method for manufacturing the semiconductor device.

Then, as shown in FIG. 7A, a first semiconductor chip SC1 is mounted over a wiring board IP. At this point, connection terminals CUP are coupled to electrodes IEL, and sealing resin UFR1 is formed. The sealing resin UFR1 can be formed by using film-shaped resin, such as a die attachment film (DAF), or can be formed by dripping liquid resin. In the former case, the sealing resin UFR1 is applied over the wiring board IP before the first semiconductor chip SC1 is mounted over the wiring board IP. This can make it easier to form the planar shape of the sealing resin UFR1 as described by referring to FIG. 2. In the latter case, the sealing resin UFR1 is applied after the first semiconductor chip SC1 is mounted over the wiring board IP. Also in the latter case, the end part of the sealing resin UFR1 forms a fillet at least downward along the sides of the first semiconductor chip SC1.

Figure 7B:
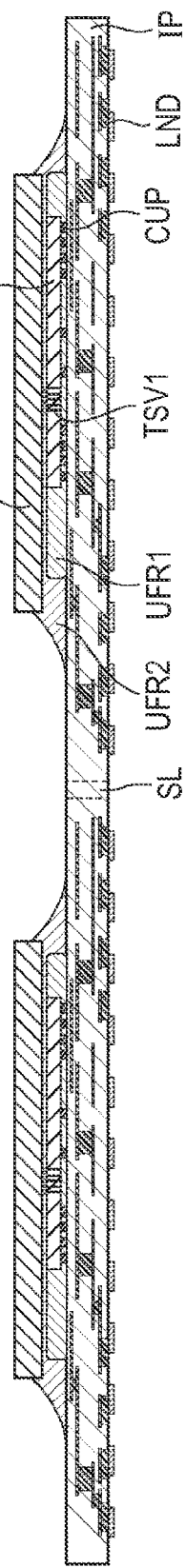

Next, as shown in FIG. 7B, a second semiconductor chip SC2 is mounted over the first semiconductor chip SC1. At this point, the first through-silicon vias TSV1 of the first semiconductor chip SC1 are coupled to the connection terminals EL21 of the second semiconductor chip SC2. The sealing resin UFR2 is formed afterward. The sealing resin UFR2 is formed, for example, by dripping liquid resin. Hence, the end part of the sealing resin UFR2 forms a fillet at least downward along the sides of the second semiconductor chip SC2.

The steps shown in FIGS. 7A and 7B are performed on each of the wiring boards IP.

Figure 7C:
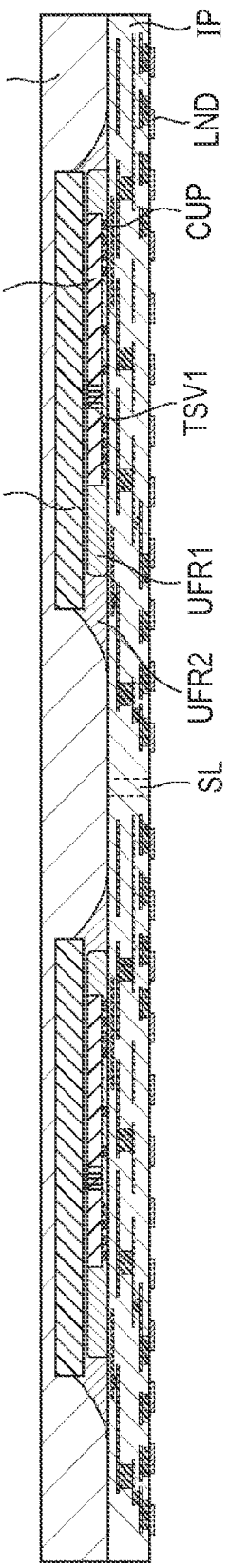

Subsequently, as shown in FIG. 7C, sealing resin MDR1 is formed. The sealing resin MDR1 is formed on the wiring boards IP all at once (batch molding method), for example, by using a single cavity (not shown) formed by a set of mold components (not shown).

In the step of forming the sealing resin MDR1, a cavity can be provided for every wiring board IP. In this case, a stack of the first semiconductor chip SC1 and the second semiconductor chip SC2 is sealed for every individual wiring board IP (individual molding method). In this case, since each of the wiring boards IP is covered with an individual cavity (not shown), the side surfaces of the wiring board IP are not flush with the side surfaces of the sealing resin MDR1.

Then, as shown in FIG. 8A, external connection terminals SB are provided to every wiring board IP.

Subsequently, as shown in FIG. 8B, the wiring boards IP and sealing resin MDR1 are divided along the scribe regions SL. Thus, the semiconductor devices SD are prepared.

Next, the main action and effect of this embodiment will be described. According to the present embodiment, both the through-silicon via area TSVA1 and the first semiconductor chip SC1 are rectangular in plan. The long sides of the through-silicon via area TSVA1 are in parallel with the long sides of the first semiconductor chip SC1. This layout can make the distances between the short sides of the through-silicon via area TSVA1 and the edges of the first semiconductor chip SC1 longer in comparison with the case where the through-silicon via area TSVA1 is placed so that its long sides are in parallel with the short sides of the first semiconductor chip SC1. Therefore, even if stress is applied onto the first semiconductor chip SC1, it can be prevented that the substrate SUB1 of the first semiconductor chip SC1 becomes cracked starting from the through-silicon via area TSVA1. An example of the stress is thermal stress. The thermal stress arises from, for example, the differences in linear expansion coefficient among the substrate SUB1, wiring board IP, and sealing resin MDR1. If the through-silicon via area TSVA1 has long sides that are ten or more times longer than the short sides, the stress easily cracks the substrate SUB1.

The center of the first semiconductor chip SC1 is susceptible to the heaviest stress. However, the center of the through-silicon via area TSVA1 in this embodiment is off center of the first semiconductor chip SC1 as viewed in a cross section taken along a short side of the first semiconductor chip SC1. Therefore, it can be further prevented that the substrate SUB1 of the first semiconductor chip SC1 becomes cracked starting from the through-silicon via area TSVA1.

<First Modification of First Embodiment>

Figure 10:
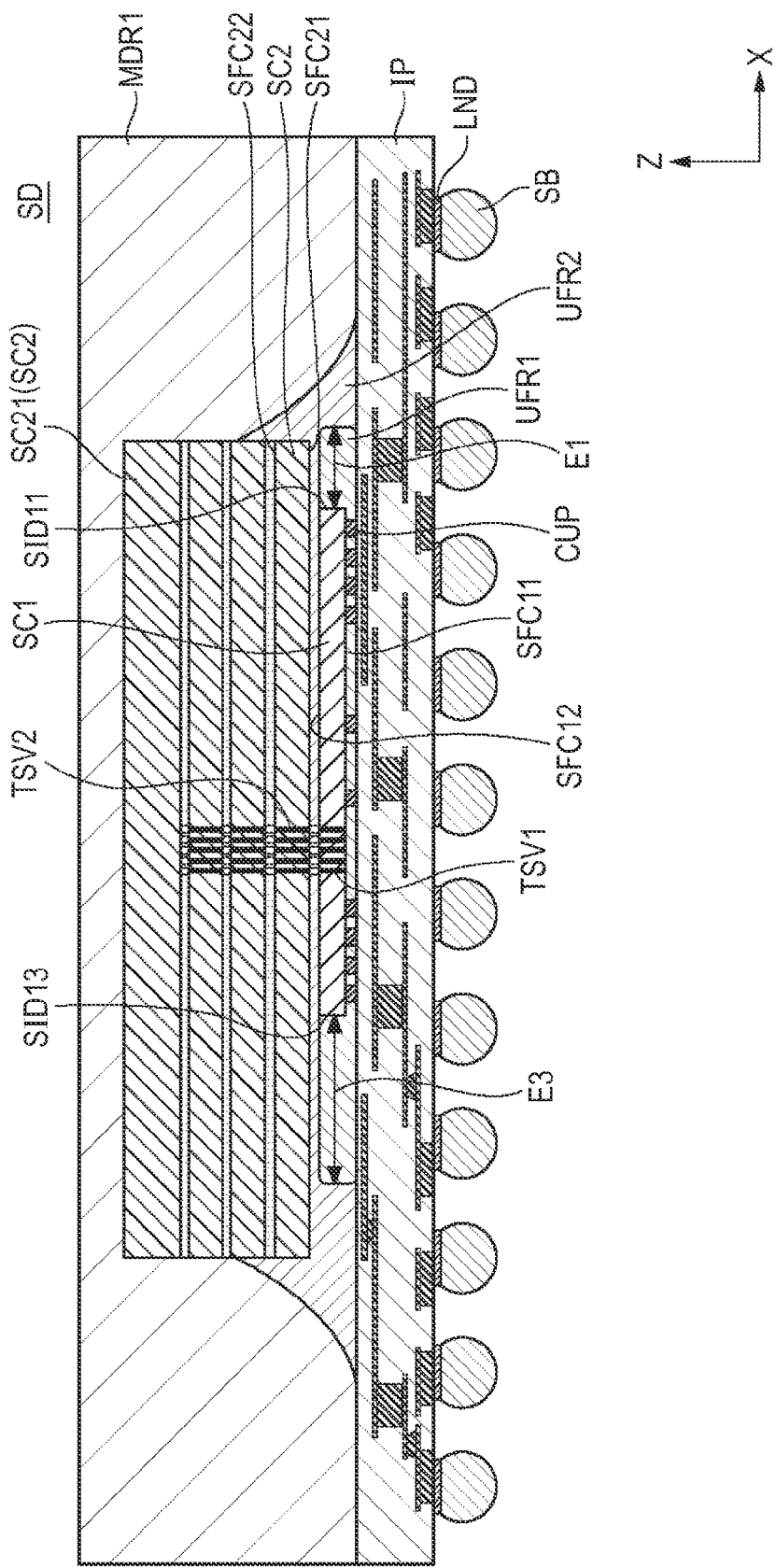
FIG. 10 is a cross-sectional view showing the configuration of a semiconductor device according to the first modification of the first embodiment.

FIG. 10 is a cross-sectional view showing the configuration of a semiconductor device SD according to the first modification. The semiconductor device SD according to the first modification has the same configuration as the semiconductor device SD of the first embodiment except for the following.

The first difference is that the semiconductor device SD includes the second semiconductor chips SC2. The second semiconductor chips SC2 are stacked to each other. At least one of the second or higher positioned second semiconductor chips SC2, for example, the uppermost second semiconductor chip SC21 is made thicker than the other second semiconductor chips SC2. However, the uppermost second semiconductor chip SC21 also can have the same thickness as the other second semiconductor chips SC2. The second semiconductor chips SC2 that are stacked to each other are stacked over the first semiconductor chip SC1.

Each of the second semiconductor chips SC2 has second through-silicon vias TSV2. The second through-silicon vias TSV2 couples one second semiconductor chip SC2 to the other second semiconductor chip SC2 positioned thereabove. Thus, the first semiconductor chip SC1 is electrically coupled to the second or higher positioned second semiconductor chips SC2 through the second through-silicon vias TSV2. The second semiconductor chips SC2 are, for example, all memory chips. However, at least one of the second semiconductor chips SC2 may include a logic circuit. In the example shown in FIG. 10, the four sides of the respective second semiconductor chips SC2 overlap with each other in plan view. In addition, the second through-silicon vias TSV2 of the respective second semiconductor chips SC2 overlap with each other in plan view.

As viewed in plan view, at least some of the second through-silicon vias TSV2 overlap with any of the first through-silicon vias TSV1. Laying out the vias in the aforementioned manner can simplify the pattern of conductors between the second through-silicon vias TSV2 and the first through-silicon vias TSV1 coupled thereto.

In the example shown in FIG. 10, the second through-silicon vias TSV2 are arranged on the same grid points as the first through-silicon vias TSV1. The second semiconductor chips SC2 also have the same areas as the through-silicon via areas TSVA1. For instance, in the case where the second semiconductor chips SC2 are memory chips, the second through-silicon vias TSV2 are arranged in accordance with specifications set out in JEDEC JESD 229. The grids made by the array of the first through-silicon vias TSV1 overlap with the grids made by the array of the second through-silicon vias TSV2, respectively, in plan view.

Figure 11:
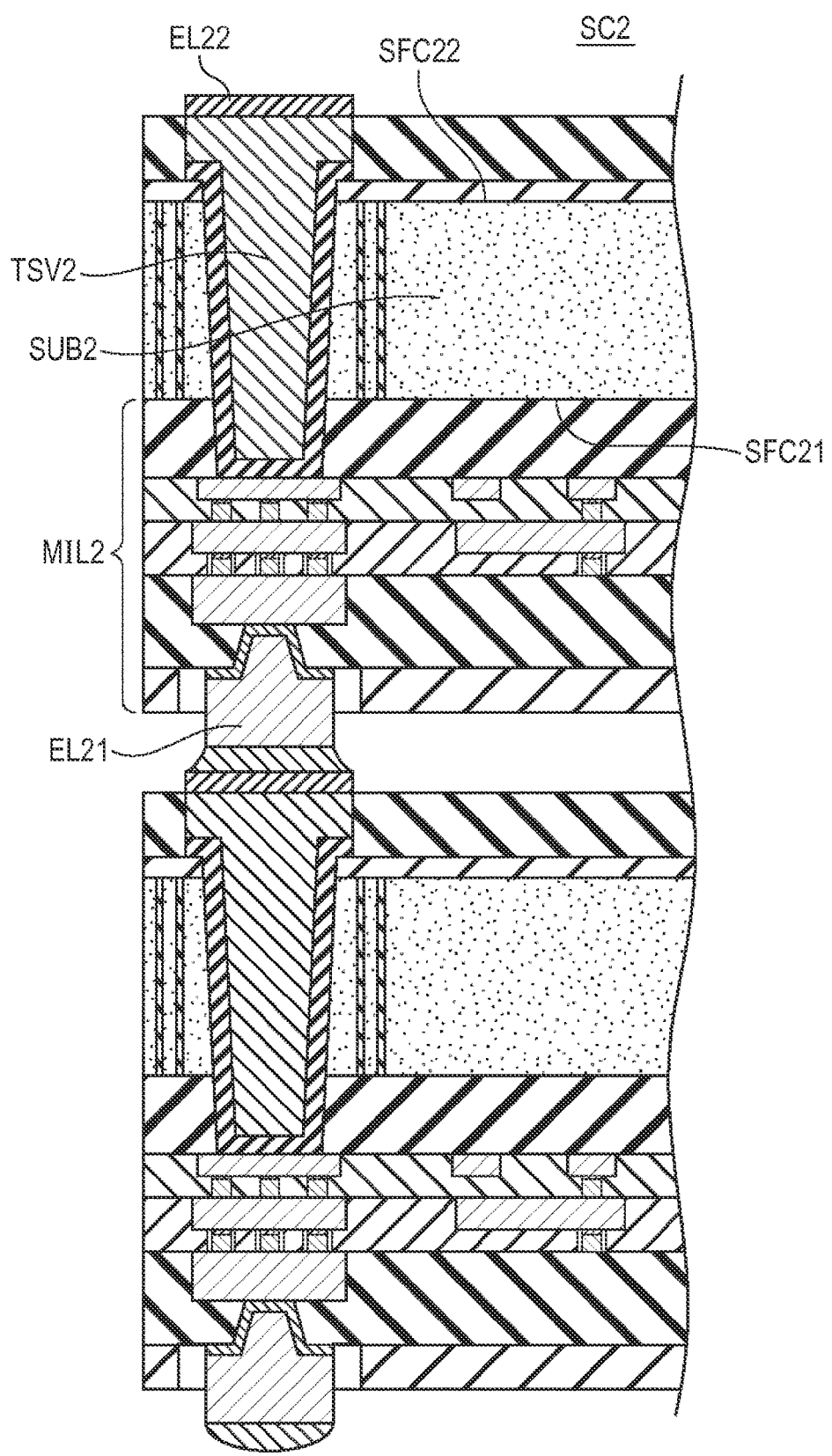
FIG. 11 illustrates the cross-sectional structure of the second semiconductor chips.

FIG. 11 illustrates the cross-sectional structure of the second semiconductor chips SC2. In the example shown in FIG. 11, a second through-silicon via TSV2 is formed in a substrate SUB2 of a second semiconductor chip SC2. The second through-silicon via TSV2 is made of a conductive material, such as copper, and passes through the substrate SUB2. Also, an insulating film is embedded in the substrate SUB2 so as to surround the second through-silicon via TSV2.

Over an element formation surface SFC21 of the substrate SUB2, a multilevel interconnection layer MIL2 is formed. The second through-silicon via TSV2 is coupled to a connection terminal EL21 provided over the multilevel interconnection layer MIL2 through vias or the like in the multilevel interconnection layer MIL2. The connection terminal EL21 is, for example, a conductor post made of copper or other materials. In addition, the second through-silicon via TSV2 is coupled to an electrode EL22 formed over the back surface SFC22 of the substrate SUB2.

The method for manufacturing the semiconductor device SD according to the first modification is the same as that according to the first embodiment, except that the second semiconductor chips SC2 are stacked to each other in advance.

The first modification can also provide the same effect as the first embodiment.

<Second Modification of First Embodiment>

Figure 12:
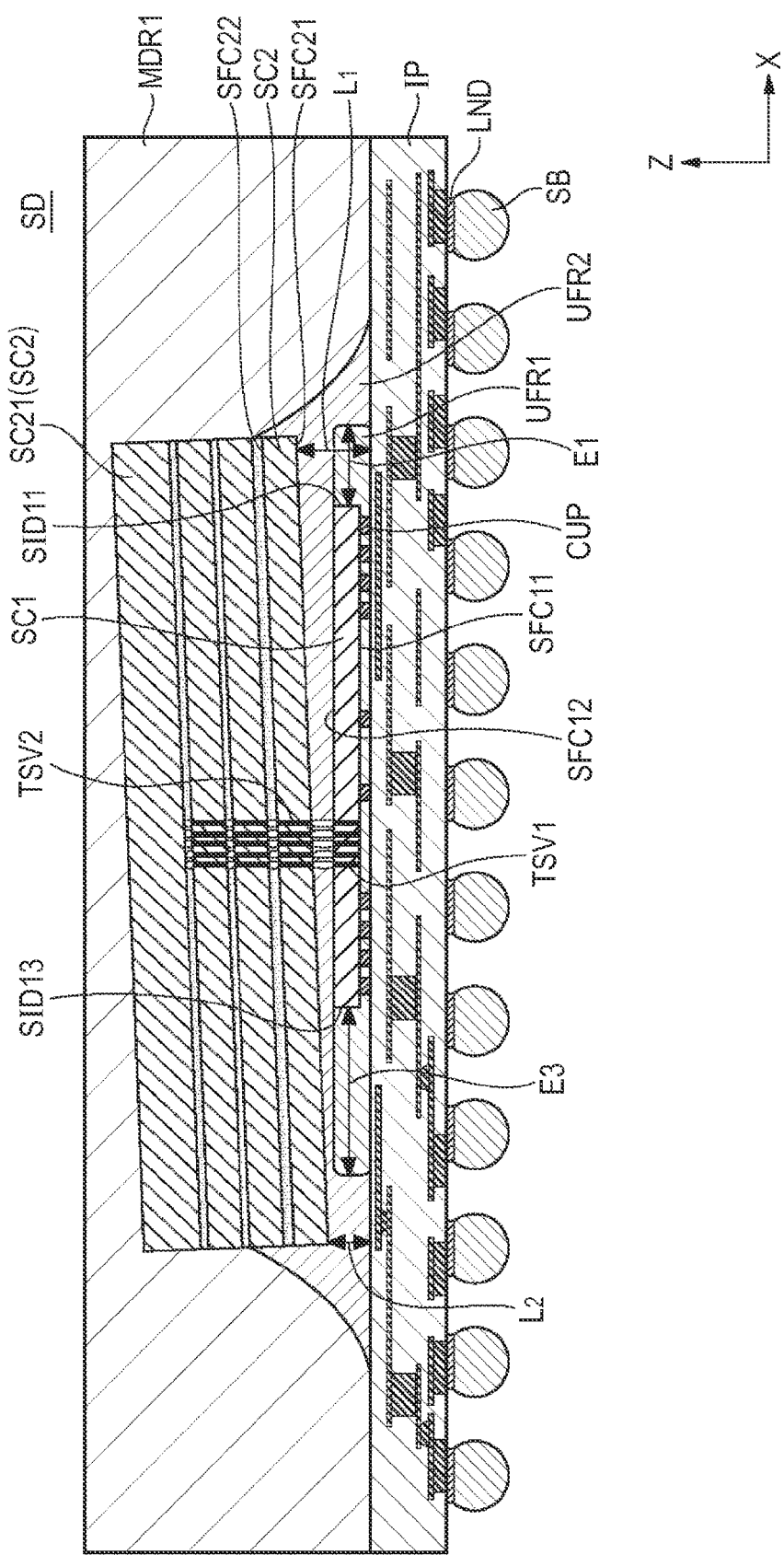
FIG. 12 is a cross-sectional view to illustrate the configuration of a semiconductor device according to the second modification of the first embodiment.

FIG. 12 is a cross-sectional view to illustrate the configuration of a semiconductor device SD according to the second modification. The semiconductor device SD according to the second modification has the same configuration as the semiconductor device SD according to the first modification, except that as viewed in the direction where the components are stacked, the second semiconductor chips SC2 are in a tilt position with respect to the wiring board IP.

Specifically, a distance L2 between an end part of the second semiconductor chips SC2 near the long side SID13 and the wiring board IP is shorter than a distance L1 between an end part of the second semiconductor chips SC2 near the long side SID11 and the wiring board IP. The tilt is determined, for example, by the average of the semiconductor devices SD.

The second modification can also provide the same effect as the first embodiment. The second semiconductor chips SC2 disposed over the first semiconductor chip SC1 are likely to tilt about the first through-silicon vias TSV1. In the first embodiment, the first through-silicon vias TSV1 are located relatively near the long side SID13. Because of this, the second semiconductor chips SC2 are likely to abut on the long side SID11 of the first semiconductor chip SC1 rather than the long side SID13. On the contrary, the second semiconductor chips SC2 in this modification are originally designed to tilt so that the distance L2 becomes smaller. Therefore, even if the second semiconductor chips SC2 tilt in the direction where the distance L1 becomes smaller due to manufacturing variations, the second semiconductor chips SC2 can be prevented from abutting on the first semiconductor chip SC1.

<Third Modification of First Embodiment>

The semiconductor device SD according to the third modification has the same configuration as the semiconductor device SD according to any of the first embodiment and the first and second modifications, except for the configuration of the first semiconductor chip SC1.

Figure 13:
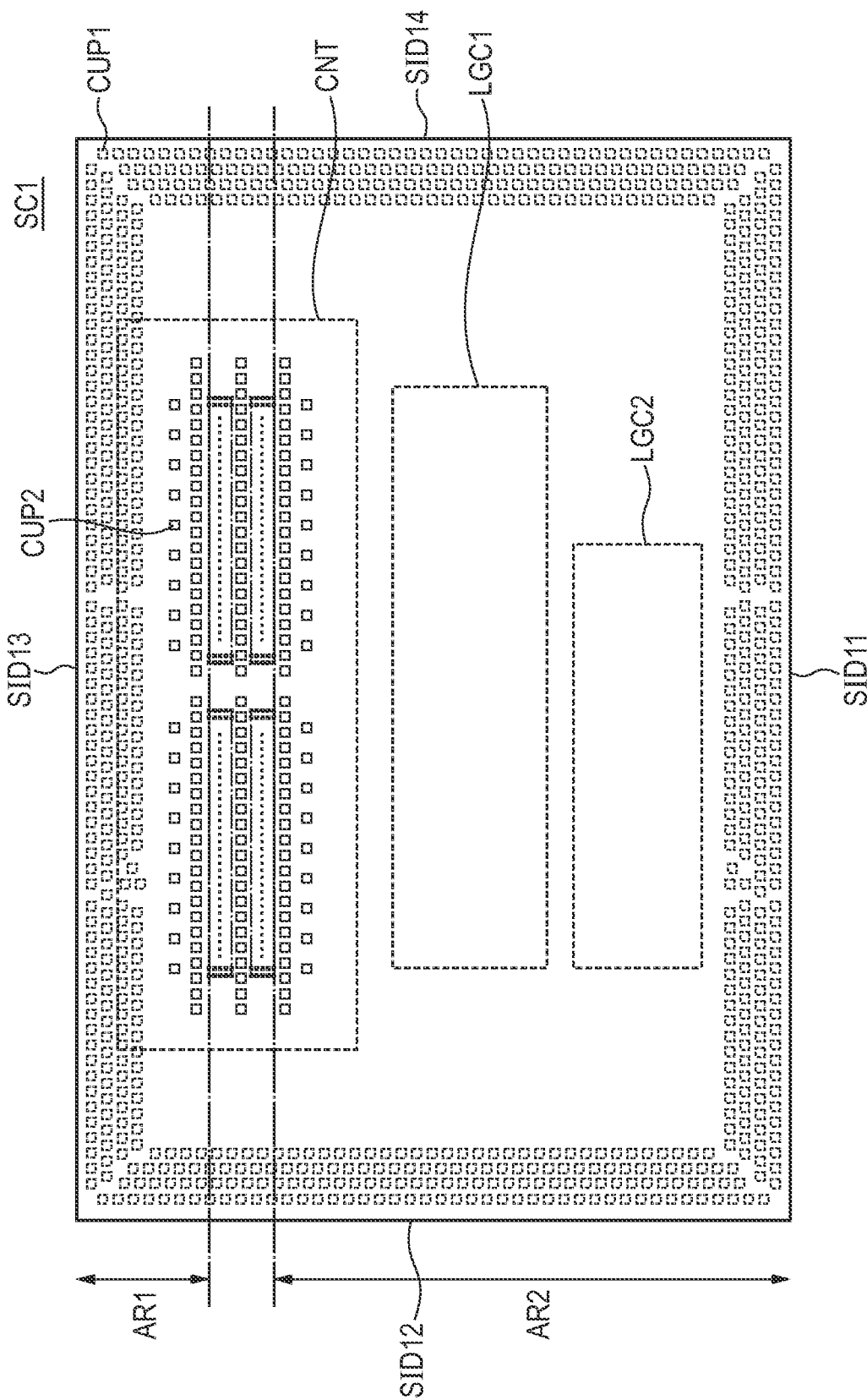
FIG. 13 is a plan view to illustrate the configuration of the first semiconductor chip included in a semiconductor device according to the third modification of the first embodiment.

FIG. 13 illustrates the configuration of the first semiconductor chip SC1 according to the third modification. The semiconductor chip SC1 according to the third modification has the same configuration as the semiconductor chip SC1 according to any of the first embodiment and the first and second modifications except for the following.

The first difference is that the first semiconductor chip SC1 has a second circuit formation area LGC2. A second circuit is formed in the second circuit formation area LGC2. In the example shown in FIG. 13, the second circuit formation area LGC2 is located farther from the through-silicon via area TSVA1 than the first circuit formation area LGC1 is. Specifically, the second circuit formation area LGC2 is arranged opposite to the through-silicon via area TSVA1 with respect to the first circuit formation area LGC1.

In addition, the through-silicon via area TSVA1 is located even nearer to the long side SID13. This layout can make the second area AR2 wider, thereby allocating the first circuit formation area LGC1 and second circuit formation area LGC2 to the second area AR2. The control circuit formation area CNT overlaps with some of the connection terminals CUP1 in plan view.

The third modification can also provide the same effect as any of the first embodiment and the first and second modifications. In addition, a plurality of circuits can be formed in the second area AR2.

<Fourth Modification of First Embodiment>

The semiconductor device SD according to the fourth modification has the same configuration as the semiconductor device SD according to any of the first embodiment and the first to third modifications except for the configuration of the first semiconductor chip SC1.

Figure 14:
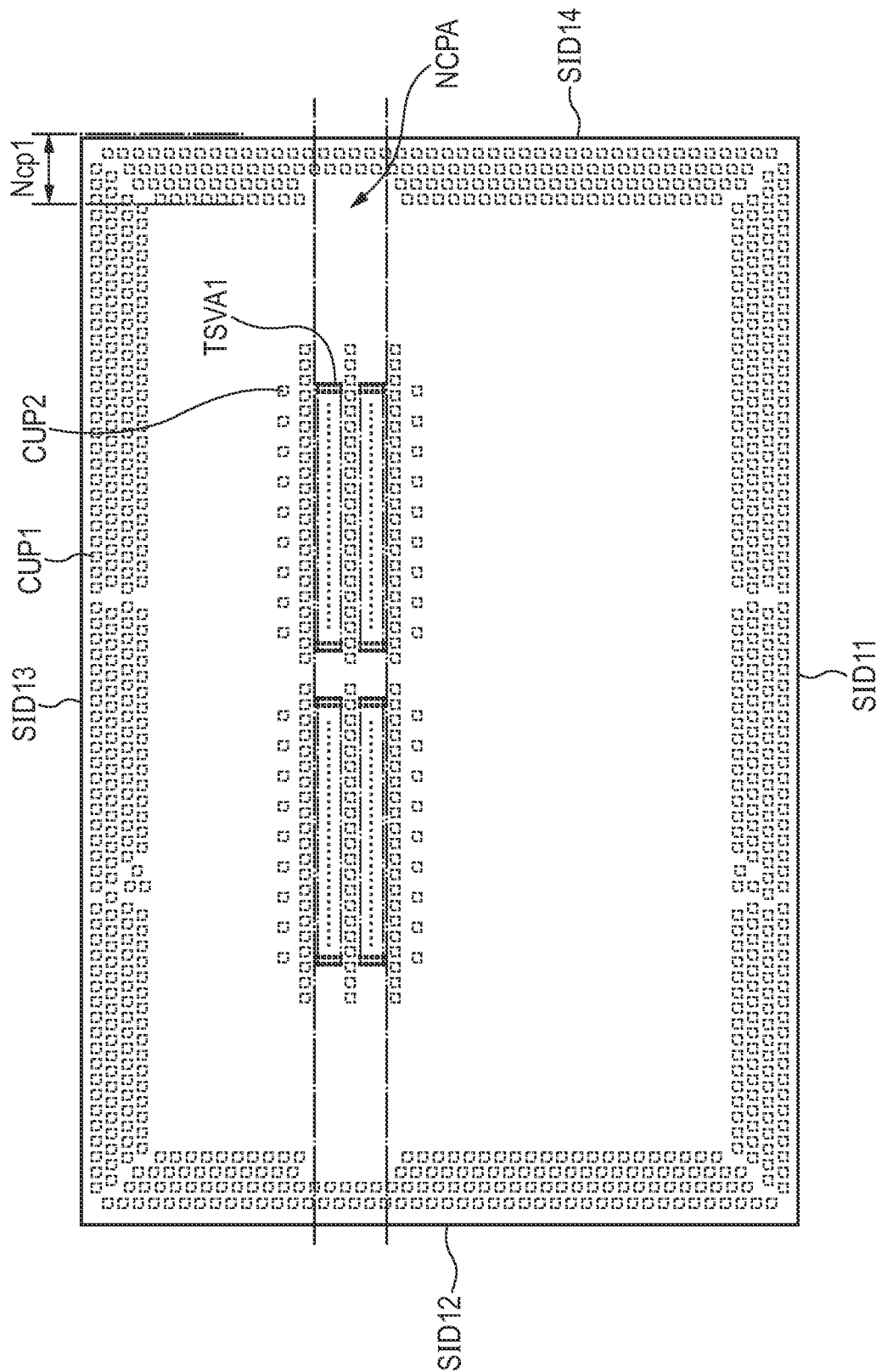
FIG. 14 is a plan view to illustrate the configuration of the first semiconductor chip included in a semiconductor device according to the fourth modification of the first embodiment.

FIG. 14 illustrates the configuration of the first semiconductor chip SC1 according to the fourth modification. The semiconductor chip SC1 according to the modification has the same configuration as the semiconductor chip SC1 according to any of the first embodiment and the first to third modifications except for the layout of connection terminals CUP1.

Specifically, the first semiconductor chip SC1 has non-conductor post areas NCPA at the edges. The non-conductor post area NCPA is an area where some of the connection terminals CUP disposed along the edges of the first semiconductor chip SC1 are removed. In other words, the non-conductor post area NCPA is established by reducing the number of rows of the connection terminals CUP1 in part. The non-conductor post area NCPA is provided at areas overlapping with the through-silicon via area TSVA1 in a direction parallel with the short sides of the first semiconductor chip SC1. In other words, in the direction along the edges of the first semiconductor chip SC1, the number of the connection terminals CUP1 per unit length in the area where the non-conductor post area NCPA is provided is fewer than the number of the connection terminals CUP1 per unit length in the other area.

The fourth modification can also provide the same effect as any of the first embodiment and the first to third modifications. The non-conductor post area NCPA is provided at areas overlapping with the through-silicon via area TSVA1 in a direction parallel with the short sides of the first semiconductor chip SC1. Even if thermal stress occurs due to the difference in linear expansion coefficient between the substrate SUB1 of the first semiconductor chip SC1 and the wiring board IP, the non-conductor post area NCPA makes this stress hard to be applied to the through-silicon via area TSVA1. Therefore, it can be further prevented that the substrate SUB1 of the first semiconductor chip SC1 becomes cracked starting from the through-silicon via area TSVA1.

<Fifth Modification of First Embodiment>

Figure 15:
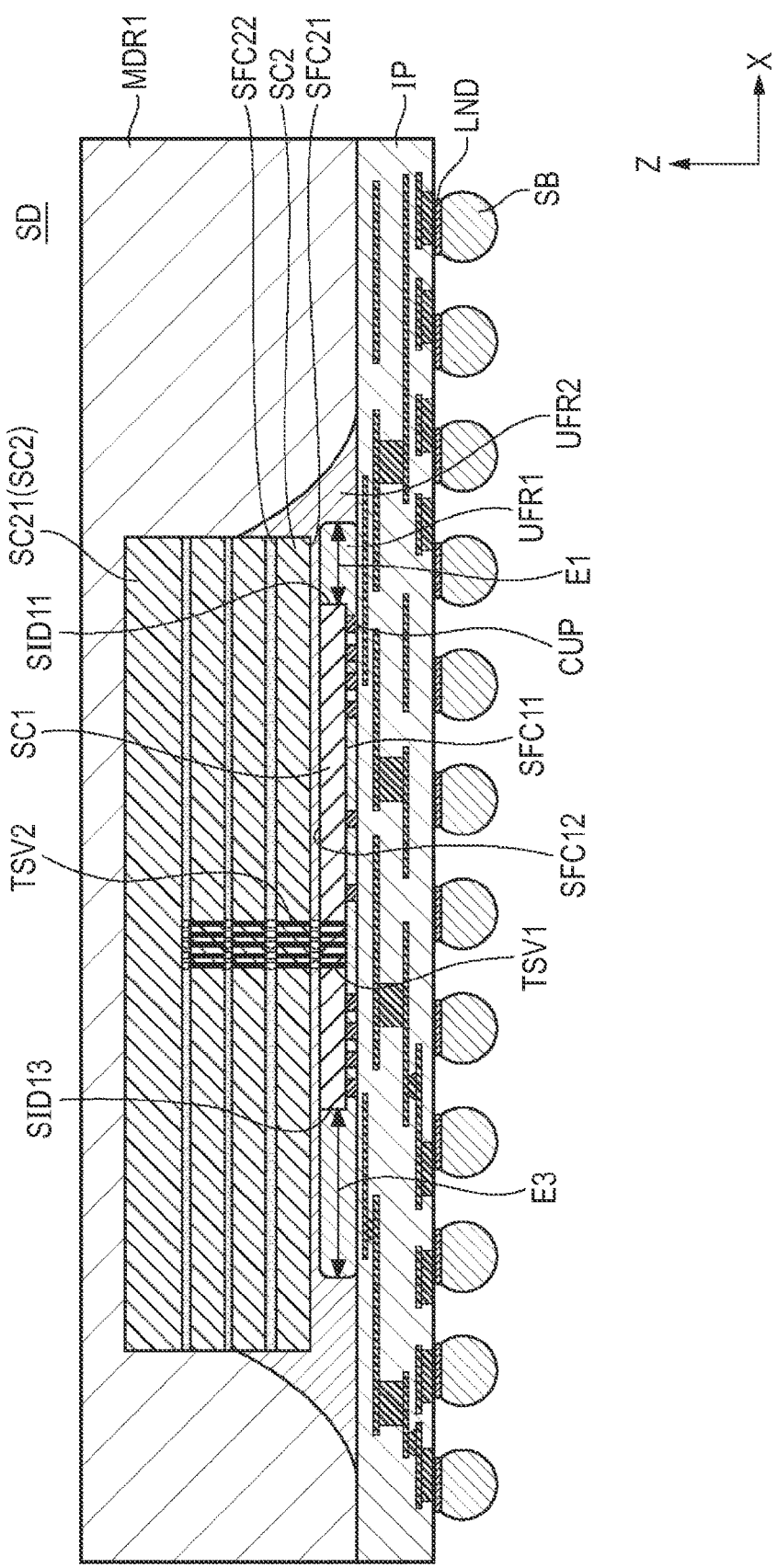
FIG. 15 is a cross-sectional view showing the configuration of a semiconductor device according to the fifth modification of the first embodiment.

FIG. 15 is a cross-sectional view showing the configuration of a semiconductor device SD according to the fifth modification. The semiconductor device SD according to this modification has the same configuration as any of the first embodiment and the first to fourth modifications, except that the center of the first semiconductor chip SC1 is aligned with the center of the wiring board IP as viewed in a cross section taken along a short side of the first semiconductor chip SC1. Therefore, the center of the second semiconductor chips SC2 is not aligned with the center of the wiring board IP.

The fifth modification can also provide the same effect as any of the first embodiment and the first to fourth modifications. Aligning the first semiconductor chip SC1 and the wiring board IP at the center allows the electrodes IEL to be disposed at the center of the wiring board IP. This makes it easier to design the line layout of the wiring board IP.

<Sixth Modification of First Embodiment>

Figure 16:
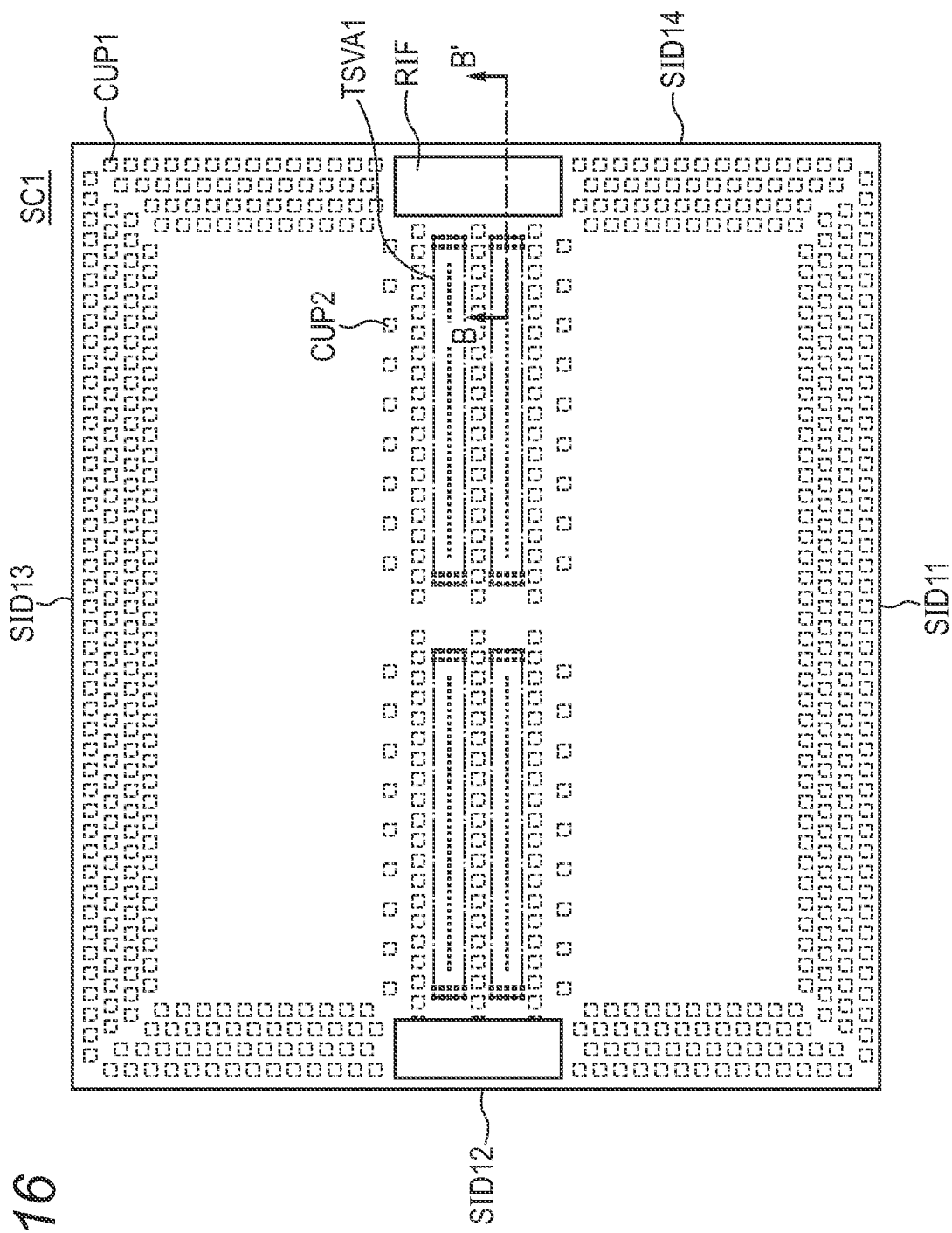
FIG. 16 is a plan view showing the configuration of the first semiconductor chip included in a semiconductor device according to the sixth modification of the first embodiment.
Figure 17:
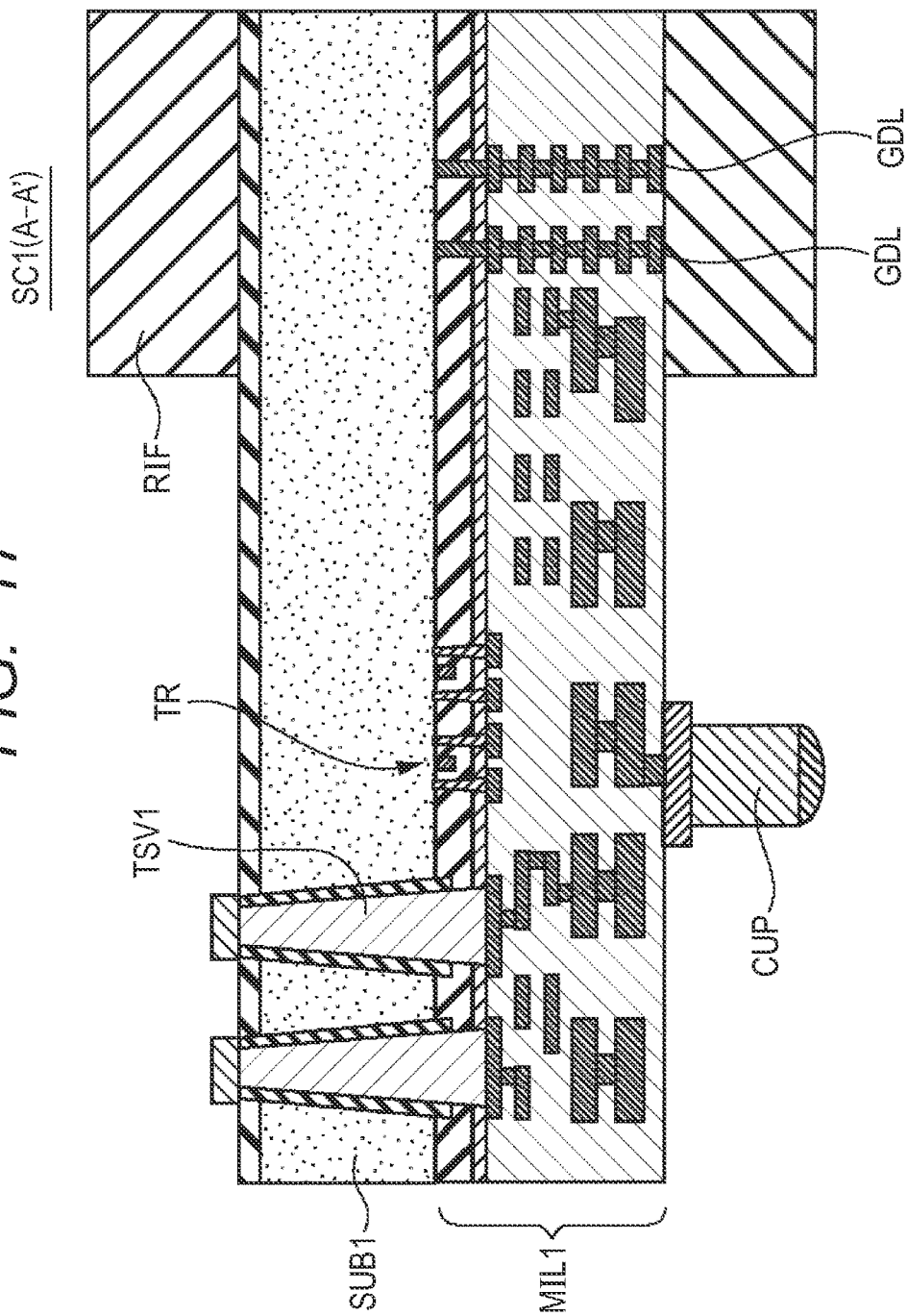
FIG. 17 is a cross-sectional view taken along line B-B' in FIG. 16.

FIG. 16 is a plan view showing the configuration of the first semiconductor chip SC1 included in the semiconductor device SD according to the sixth modification. FIG. 17 is a cross-sectional view taken along B-B' in FIG. 16. The semiconductor device SD according to this modification has the same configuration as any of the first embodiment and the first to fifth modifications except for the following.

The first difference is that the semiconductor device SD has a reinforcing member RIF. The reinforcing member RIF is attached to at least one surface of the first semiconductor chip SC1. As viewed in plan view, the reinforcing member RIF is provided at intersections of the through-silicon via areas TSVA1 and the short sides SID12, SID14 of the first semiconductor chip SC1. The reinforcing member RIF is made of, for example, a material of higher strength than the sealing resin UFR1, more specifically, a resin or a metal of higher strength than the sealing resin UFR1.

In addition, guard rings GDL are provided in the multilevel interconnection layer MIL1 of the first semiconductor chip SC1. The guard rings GDL are provided in multiple layers at least in part. The guard rings GDL that are provided at intersections of the through-silicon via areas TSVA1 and the short sides SID12, SID14 of the first semiconductor chip SC1 in plan view are greater in number than the guard rings GDL in the other area.

The sixth modification can also provide the same effect as any of the first embodiment and the first to fifth modifications. Providing the reinforcing members RIF can prevent areas of the substrate SUB1 between the through-silicon via areas TSVA1 and the short sides SID12, SID14 from cracking. Providing more guard rings GDL at the intersections of the through-silicon via areas TSVA1 and the short sides SID12, SID14 of the first semiconductor chip SC1 than the other area can further enhance the crack prevention effect.

<Second Embodiment>

Figure 18:
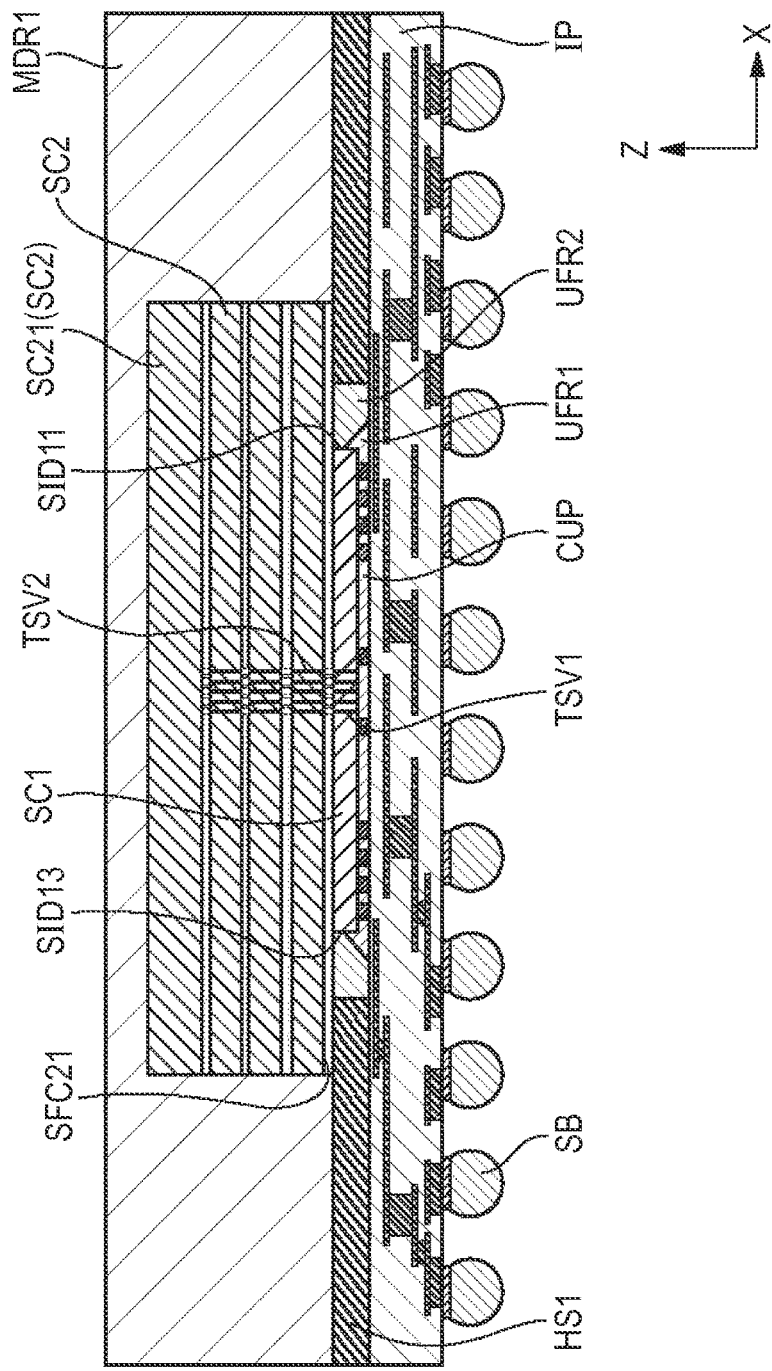
FIG. 18 is a cross-sectional view showing the configuration of a semiconductor device according to the second embodiment.

FIG. 18 is a cross-sectional view showing the configuration of a semiconductor device SD according to the second embodiment. The semiconductor device SD according to this embodiment has the same configuration as the first embodiment or the first modification except for the following. FIG. 18 shows a similar semiconductor device SD as the first modification.

The first difference is that a heat-dissipating member HS1 is provided over an area of the wiring board IP which does not overlap with the first semiconductor chip SC1. The heat-dissipating member HS1 is made of a metal plate, such as a copper plate or an aluminum plate, and is partially laid below an extending part, which stretches out further than the first semiconductor chip SC1 in plan view, of a second semiconductor chip SC2. In addition, an area of the heat-dissipating member HS1 which does not overlap with the second semiconductor chip SC2 in plan view is laid over at least one external connection terminal SB. The upper surface of the heat-dissipating member HS1 may be set lower or higher than the back surface SFC12 of the first semiconductor chip SC1 or can be flush therewith. In addition, the upper surface of the heat-dissipating member HS1 can be set lower than the element formation surface SFC21 of the second semiconductor chip SC2. In this case, the upper surface of the heat-dissipating member HS1 and the element formation surface SFC21 are fixedly bonded to each other with an adhesive layer with high heat conductivity.

It is preferable for the heat-dissipating member HS1 not to overlap with the openings SRO in the insulating layer SR in plan view. This can prevent voids from generating in the openings SRO. Thus, the filling factor of the sealing resin UFR1, UFR2 in the opening SRO is enhanced.

Figure 19:
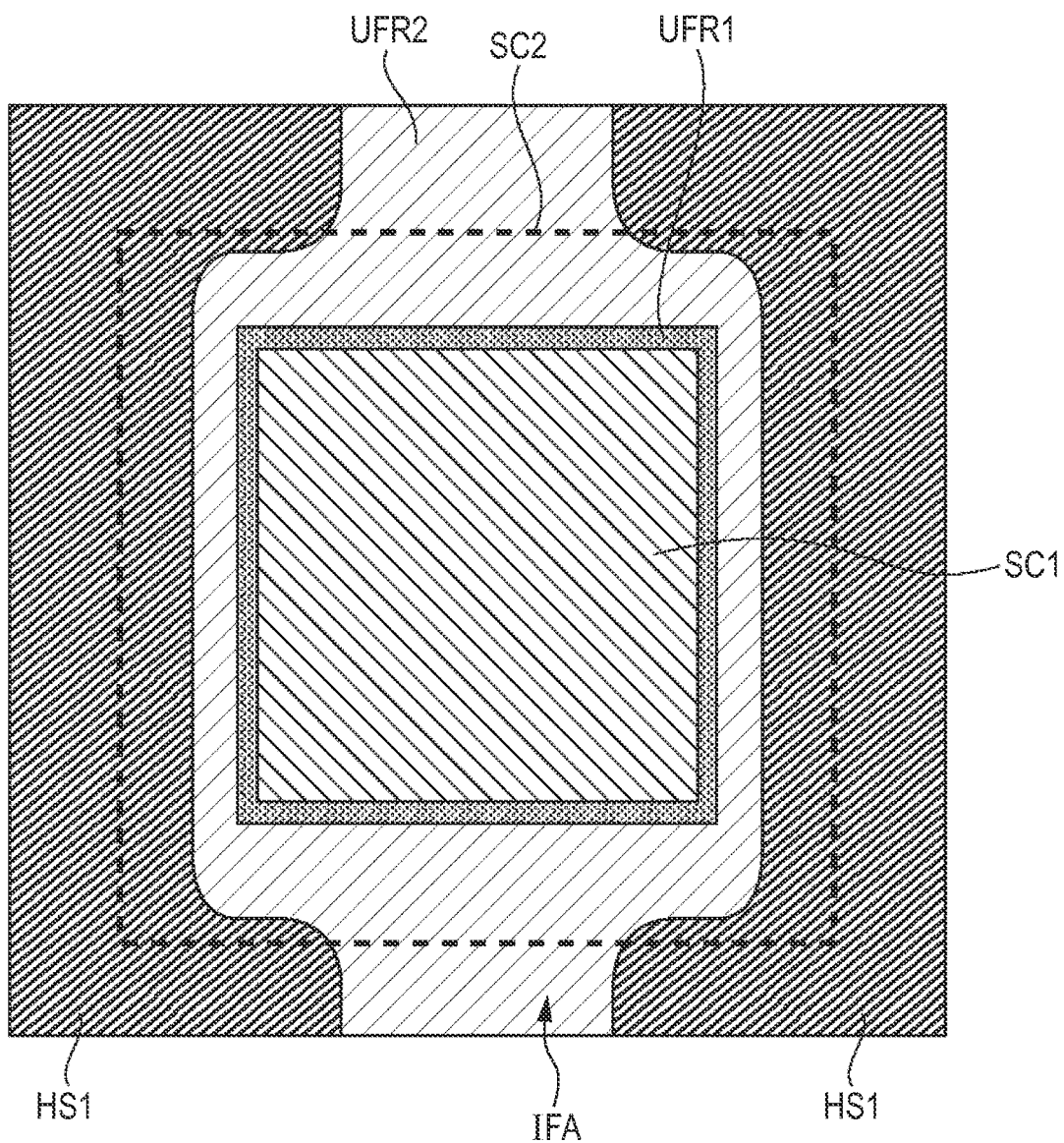
FIG. 19 is a plan view to illustrate the planar shape of a heat-dissipating member.

In the example shown in FIG. 19, the outer end surfaces of the heat-dissipating member HS1 are flush with the side surfaces of the sealing resin MDR1. Alternatively, the outer end surfaces of the heat-dissipating member HS1 can be positioned more inwardly than the side surfaces of the sealing resin MDR1 in plan view. In this case, it is preferable that the outer end surfaces of the heat-dissipating member HS1 are positioned between the outermost external connection terminals SB and the end surfaces of the wiring board IP in plan view.

An insulating layer (e.g., a resin layer) is provided between the element formation surface SFC21 of the lowermost second semiconductor chip SC2 and the heat-dissipating member HS1.

Although the sealing resin UFR2 fills a space surrounded by the second semiconductor chip SC2, wiring board IP, and heat-dissipating member HS1, the sealing resin UFR2 does not reach the side surfaces of the second semiconductor chip SC2. It is preferable to use sealing resin UFR2 with higher heat conductivity than that of the sealing resin UFR1.

The through-silicon via area TSVA1 can be provided at a position aligned with the center of the first semiconductor chip SC1 as viewed in a cross section taken along the short side SID12. The through-silicon via area TSVA1 can be also provided at a position aligned with the center of the first semiconductor chip SC1 as viewed in a cross section taken along the long side SID11. In the example shown in FIG. 18, the through-silicon via area TSVA1 is aligned with the center of the first semiconductor chip SC1, the center of the second semiconductor chip SC2, and the center of the wiring board IP in the aforementioned two cross sections. In any case, in plan view, a part of the second semiconductor chip SC2 extends out further than the first semiconductor chip SC1 and the heat-dissipating member HS1 is partially laid below the extending part.

In the example shown in FIG. 18, the end part of the sealing resin UFR1 forms a fillet along the sides of the first semiconductor chip SC1. The sealing resin UFR1 can function without the fillet.

Although the base material of the sealing resin MDR1 is a resin, the sealing resin MDR1 may contain a material with higher thermal conductivity, such as alumina, than the base resin.

FIG. 19 is a plan view to illustrate the planar shape of the heat-dissipating member HS1. In the example shown in FIG. 19, the heat-dissipating member HS1 is provided so as to surround the first semiconductor chip SC1 except for an inflow area IFA used for pouring the sealing resin MDR1. In the example shown in FIG. 19, the inflow area IFA is provided on each of two sides opposed to each other of the wiring board IP. The two inflow areas IFA are coupled to each other with an area around the first semiconductor chip SC1. The heat-dissipating member HS1 covers the wiring board IP except for the area where the first semiconductor chip SC1 is placed, its surroundings and the inflow areas IFA. If an alignment mark is formed over the wiring board IP, the heat-dissipating member HS1 does not cover the alignment mark. In addition, the heat-dissipating member HS1 overlap with at least two sides opposed to each other of the second semiconductor chip SC2. Resultantly, the four corners of the second semiconductor chip SC2 overlap with the heat-dissipating member HS1.

Alternatively, the heat-dissipating member HS1 can be provided so as to enclose all four sides of the first semiconductor chip SC1 without the inflow areas IFA.

FIGS. 20A to 20E are cross-sectional views to describe a method for manufacturing the semiconductor device SD shown in FIGS. 18 and 19. The method for manufacturing the semiconductor device SD according to the second embodiment is generally the same as the first embodiment.

Figure 20A:
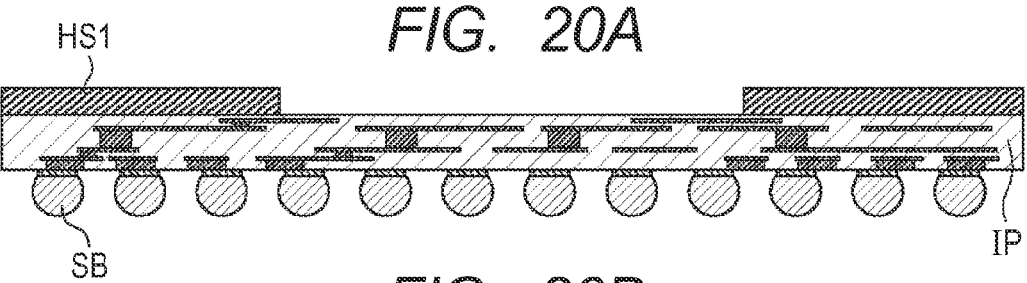
FIGS. 20A to 20E are cross-sectional views to illustrate a method for manufacturing the semiconductor device shown in FIGS. 18 and 19.

First, as shown in FIG. 20A, external connection terminals SB and a heat-dissipating member HS1 are attached to a wiring board IP.

Figure 20B:
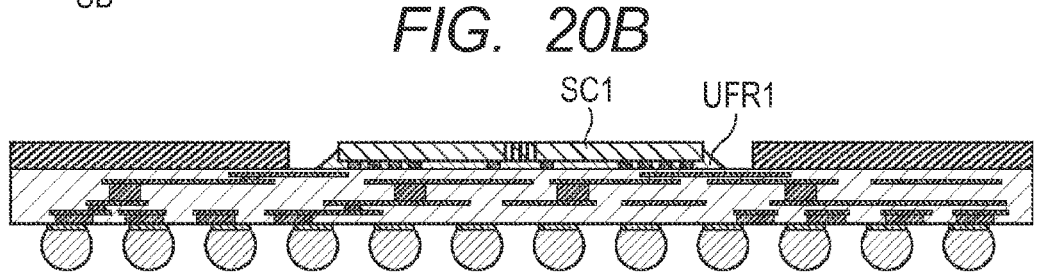
Figure 20C:
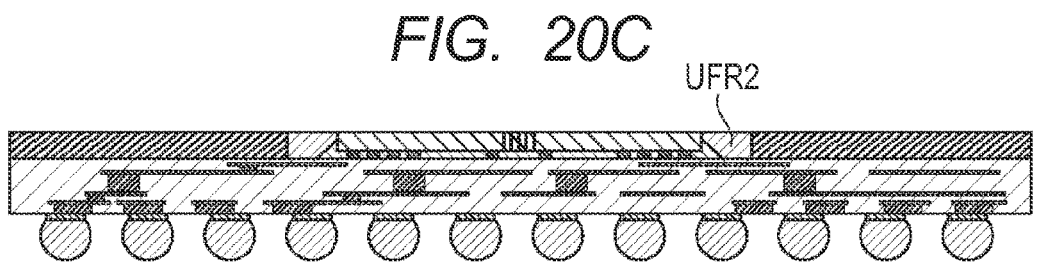

Then, as shown in FIG. 20B, a first semiconductor chip SC1 is mounted over the wiring board IP and sealing resin UFR1 is then applied. Subsequently, as shown in FIG. 20C, sealing resin UFR2 is applied. The sealing resin UFR2 is applied by, for example, dripping liquid resin.

Figure 20D:
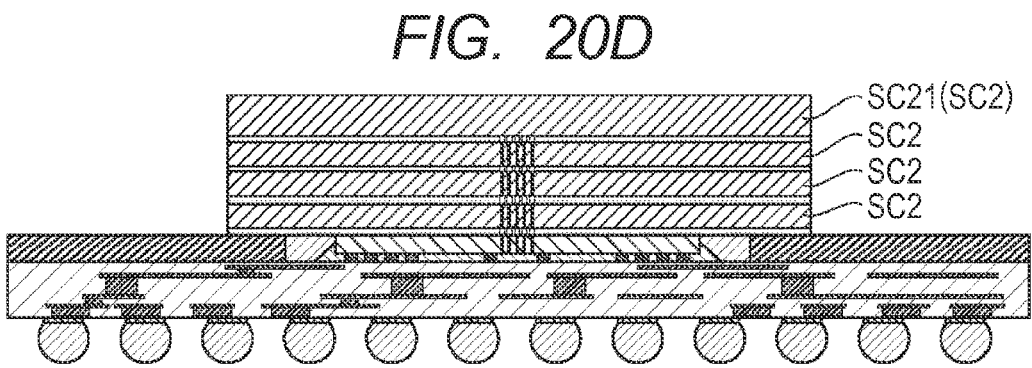

Then, as shown in FIG. 20D, a stack of second semiconductor chips SC2 is mounted over the first semiconductor chip SC1. At this point, a part of the second semiconductor chips SC2 that extends out further than the first semiconductor chip SC1 is partially positioned over the heat-dissipating member HS1.

Figure 20E:
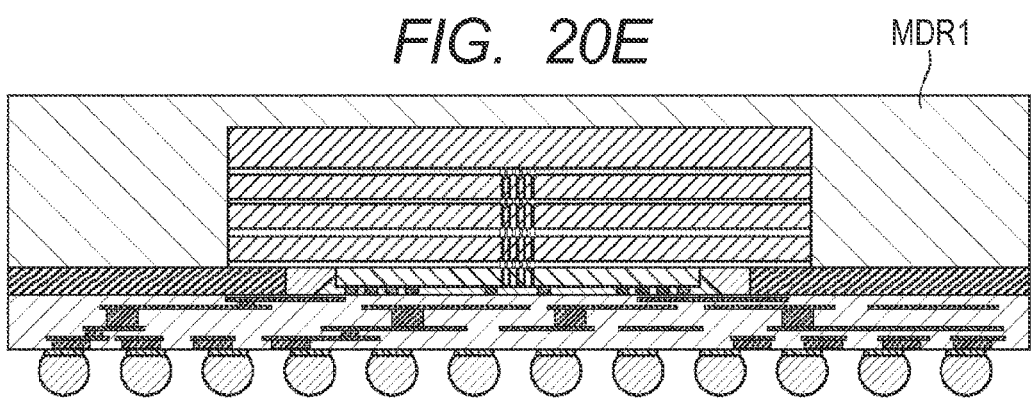

Subsequently, as shown in FIG. 20E, sealing resin MDR1 is applied. Then, singulation is performed to obtain semiconductor devices SD.

Next, the action and effect of the second embodiment will be described. In this embodiment, the second semiconductor chips SC2 are stacked over the first semiconductor chip SC1. The stacked second semiconductor chips SC2 are hard to dissipate heat compared with the first semiconductor chip SC1. Especially, the second semiconductor chips SC2 on the lower side have poor heat dissipation performance. To increase the performance, this embodiment provides the heat-dissipating member HS1 over the wiring board IP. The heat-dissipating member HS1 has a part overlapping with the second semiconductor chip SC2 and a part not overlapping with the second semiconductor chip SC2. Resultantly, the heat generated by the second semiconductor chip SC2 is dissipated through the heat-dissipating member HS1. This increases the heat dissipation performance of the second semiconductor chips SC2.

Especially in this embodiment, the outer end surfaces of the heat-dissipating member HS1 are flush with the side surfaces of the sealing resin MDR1. In other words, the outer end surfaces of the heat-dissipating member HS1 are exposed from the side surfaces of the sealing resin MDR1. The heat that has been transferred to the heat-dissipating member HS1 is effectively discharged from the exposed outer end surfaces to the outside. Hence, the heat dissipation performance of the second semiconductor chips SC2 is further enhanced.

In addition, in plan view, the area of the heat-dissipating member HS1 that does not overlap with the second semiconductor chip SC2 overlaps with at least one external connection terminal SB. This layout makes it easier for the heat transferring through the heat-dissipating member HS1 to be dissipated to the outside through the wiring board IP and external connection terminal SB. Such effect is particularly enhanced when the heat-dissipating member HS1 overlaps with through holes of the wiring board IP in plan view.

The side surfaces of the heat-dissipating member HS1 can be tapered upwardly so as to decrease the area of the heat-dissipating member HS1. This reduces the occurrence of voids in the sealing resin UFR1, UFR2.

In addition, using the sealing resin UFR2 with higher thermal conductivity than the sealing resin UFR1 enables greater heat dissipation from the second semiconductor chip SC2. In this case, it is preferable that the filler contained in the sealing resin UFR2 is smaller in diameter than the filler contained in the sealing resin MDR1. The diameter of the filler is defined based on, for example, the average particle diameter in a cross section. Furthermore, it is preferable that the sealing resin UFR2 contains the filler at a higher ratio than the sealing resin MDR1. The filler content ratio is defined based on, for example, the area ratio of the filler in a cross section.

<First Modification of Second Embodiment>

Figure 21:
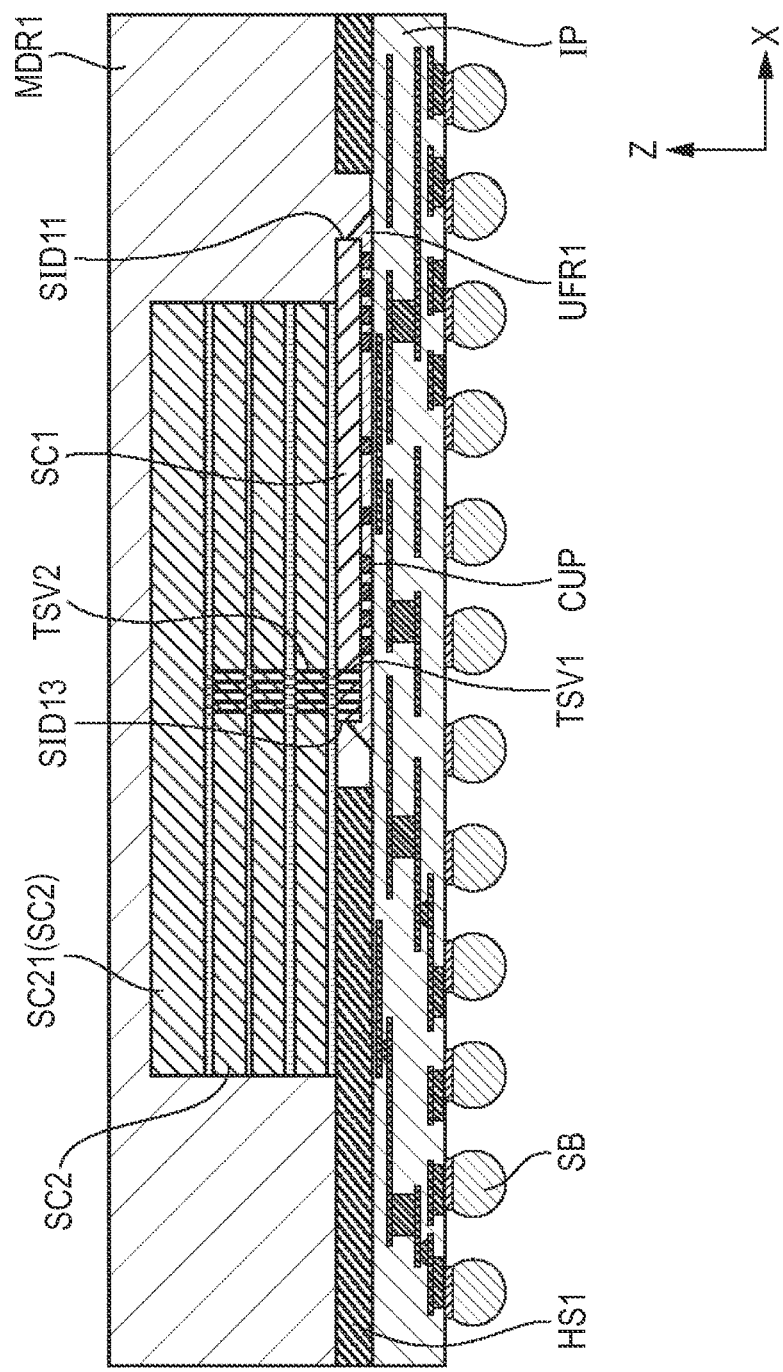
FIG. 21 is a cross-sectional view to illustrate the configuration of a semiconductor device according to the first modification of the second embodiment.

FIG. 21 is a cross-sectional view to illustrate the configuration of a semiconductor device SD according to the first modification. The semiconductor device SD according to this modification has the same configuration as the semiconductor device SD of the second embodiment except for the following.

The first difference is that the through-silicon via area TSVA1 is off center of the first semiconductor chip SC1 as viewed in either one of the cross sections taken along the short side SID12 and the long side SID11. The through-silicon via area TSVA1 is aligned with the center of the second semiconductor chip SC2 and the center of the wiring board IP. As a matter of course, the center of the second semiconductor chips SC2 is off the center of the first semiconductor chip SC1. Any of the sides of the second semiconductor chip SC2 is positioned over the first semiconductor chip SC1 in plan view.

The first modification can also provide the same effect as the second embodiment. Since the center of the second semiconductor chip SC2 is off center of the first semiconductor chip SC1, the second semiconductor chips SC2 can have a relatively large area that does not overlap with the first semiconductor chip SC1. Therefore, the area of the second semiconductor chip SC2 that surfaces the heat-dissipating member HS1 can be made larger.

<Second Modification of Second Embodiment>

Figure 22:
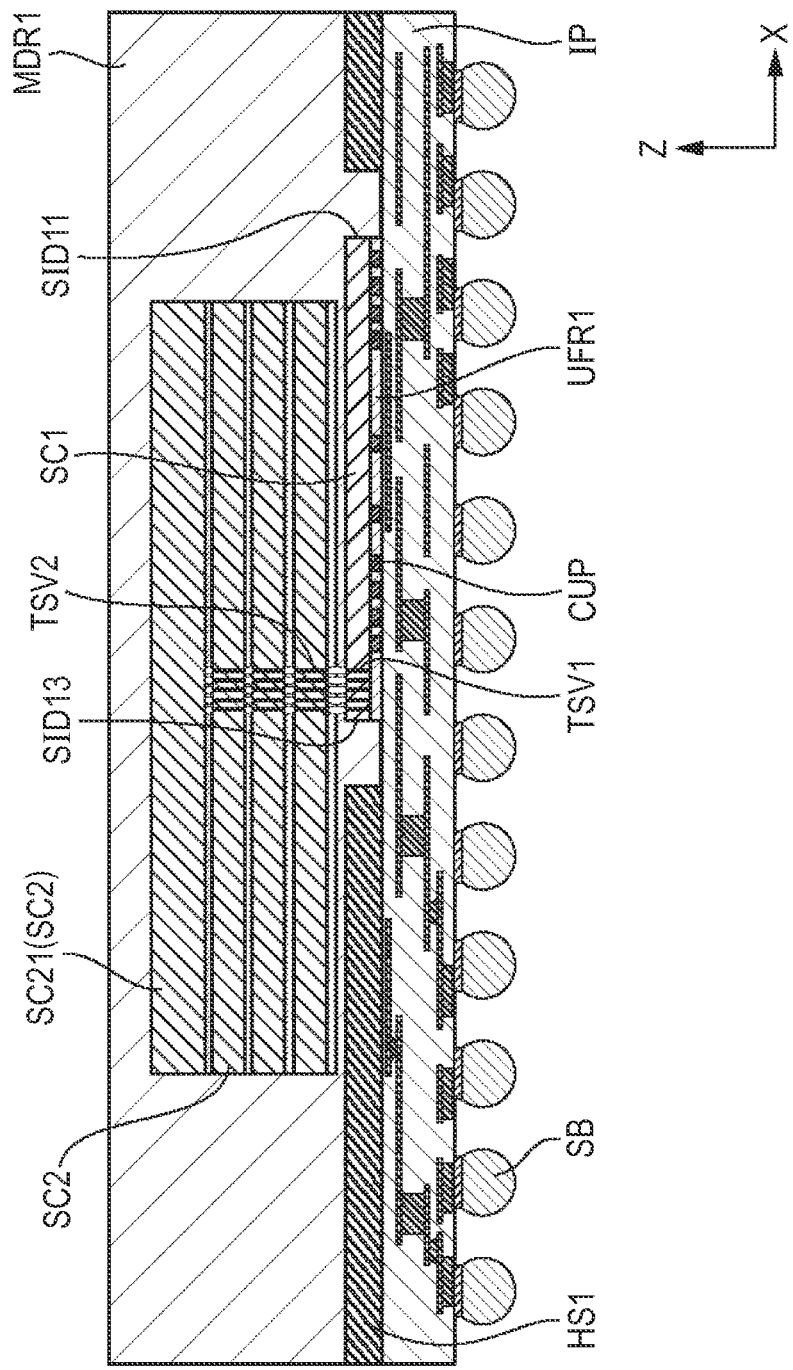
FIG. 22 is a cross-sectional view showing the configuration of a semiconductor device according to the second modification of the second embodiment.

FIG. 22 is a cross-sectional view showing the configuration of a semiconductor device SD according to the second modification. The semiconductor device SD according to this embodiment has the same configuration as the second embodiment or the first modification of the second embodiment except for the following.

The first difference is that the semiconductor device SD does not have sealing resin UFR2. Instead of that, sealing resin MDR1 fills up the space surrounded by the second semiconductor chip SC2, wiring board IP, and heat-dissipating member HS1.

The second modification can also provide the same effect as the second embodiment or the first modification.

<Third Modification of Second Embodiment>

The semiconductor device SD according to the third modification has the same configuration as any of the second embodiment and the first and second modifications of the second embodiment except that an end part of the sealing resin UFR1 does not form a fillet. To dispense with the fillet, for example, the sealing resin UFR1 is made of a DAF.

The third modification can also provide the same effect as the second embodiment or the first modification.

<Fourth Modification of Second Embodiment>

Figure 23:
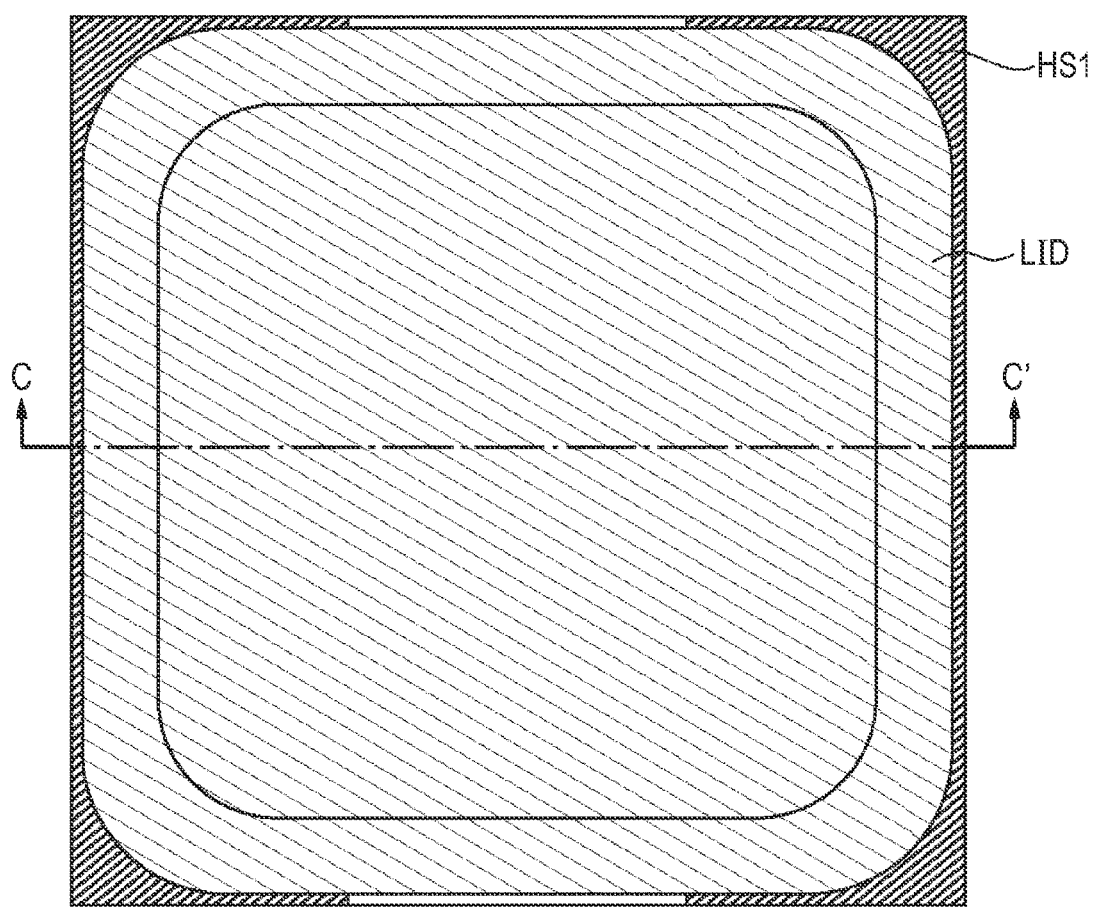
FIG. 23 is a plan view showing the configuration of a semiconductor device according to the fourth modification of the second embodiment.
Figure 24:
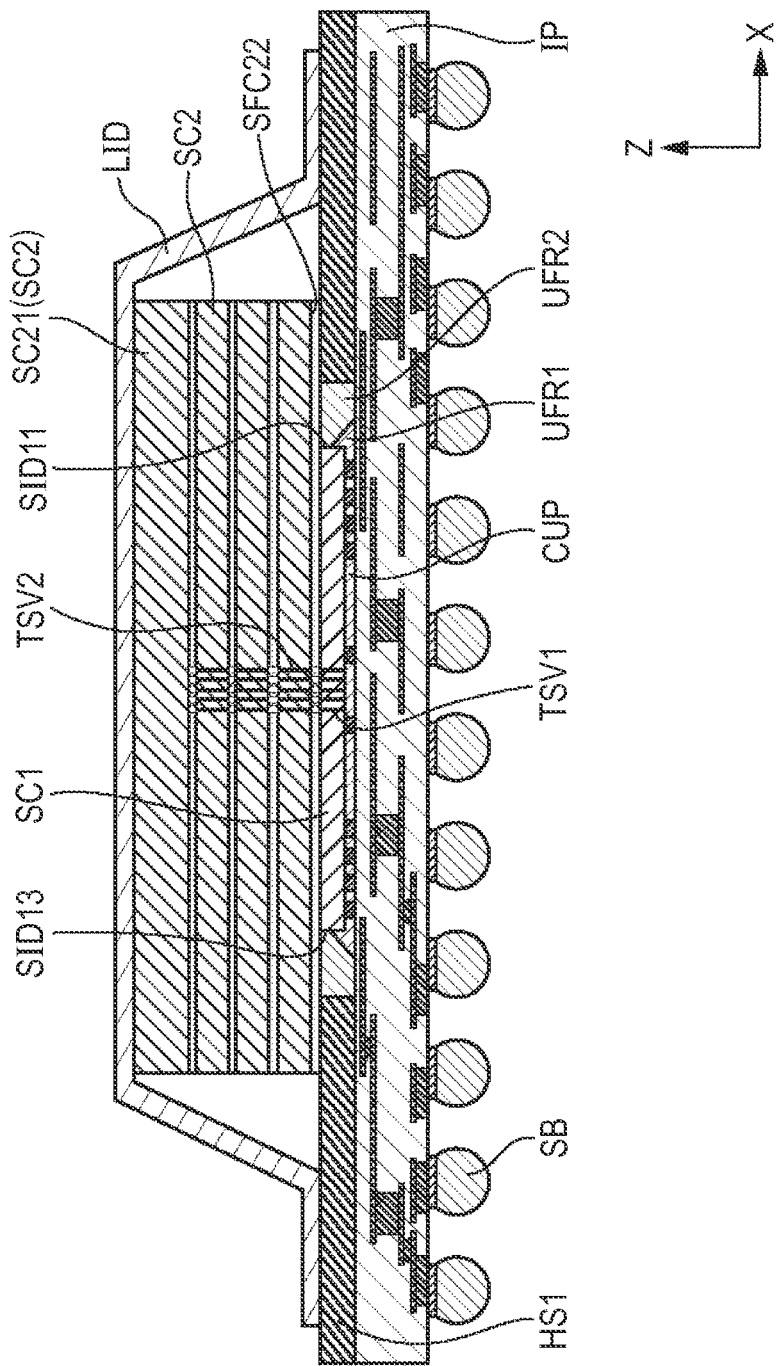
FIG. 24 is a cross-sectional view of the semiconductor device shown in FIG. 23.

FIG. 23 is a plan view showing the configuration of a semiconductor device SD according to the fourth modification. FIG. 24 is a cross-sectional view of the semiconductor device SD according to the modification. FIG. 24 corresponds to a cross section taken along C-C' in FIG. 23. The semiconductor device SD according to the fourth modification has the same configuration as any of the second embodiment and the first to third modifications except for the following.

The first difference is that the semiconductor device SD does not have the sealing resin MDR1, but has a heat-dissipating member LID instead. The heat-dissipating member LID is a plate-like member and makes contact with the back surface SFC22 of the uppermost second semiconductor chip SC21 at the center part. In addition, the heat-dissipating member LID has a rim that bends so as to surface the side surfaces of the second semiconductor chips SC2 and is attached to the heat-dissipating member HS1. A part of the heat-dissipating member LID that is attached to the heat-dissipating member HS1 is bent along a surface of the heat-dissipating member HS1.

The method for manufacturing the semiconductor device SD according to this modification is the same as that according to the second embodiment, except that this method includes a step of attaching the heat-dissipating member LID instead of the step of applying the sealing resin MDR1. The heat-dissipating member LID is attached to singulated semiconductor devices SD.

The fourth modification in which a heat-dissipating member HS1 is employed can provide the same effect as any of the second embodiment and the first to third modifications. In addition, since the uppermost second semiconductor chip SC21 is in contact with the heat-dissipating member LID, the heat generated in the second semiconductor chips SC21 escapes to the heat-dissipating member LID. This enhances the heat dissipation performance of the second semiconductor chips SC2.

Since the rim of the heat-dissipating member LID is attached to the heat-dissipating member HS1 in this modification, the heat transferred to the heat-dissipating member HS1 is discharged also from the heat-dissipating member LID. Therefore, the heat dissipation performance of the second semiconductor chips SC2 is further enhanced.

<Third Embodiment>

Figure 25:
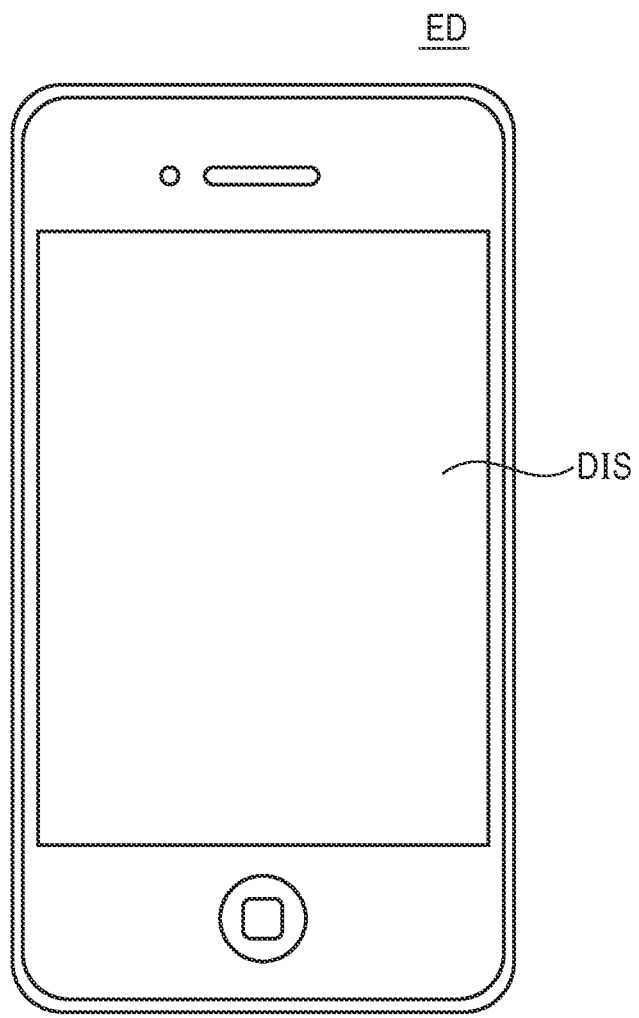
FIG. 25 is a plan view of an electronic device according to the third embodiment.

FIG. 25 is a plan view of an electronic device ED according to the third embodiment. The electronic device ED shown in FIG. 25 is a portable electronic device, such as a portable communication terminal, a portable video game console, and a portable personal computer, and includes a semiconductor device SD. The electronic device ED also includes a display DIS. The display DIS is controlled by using the semiconductor device SD.

Figure 26:
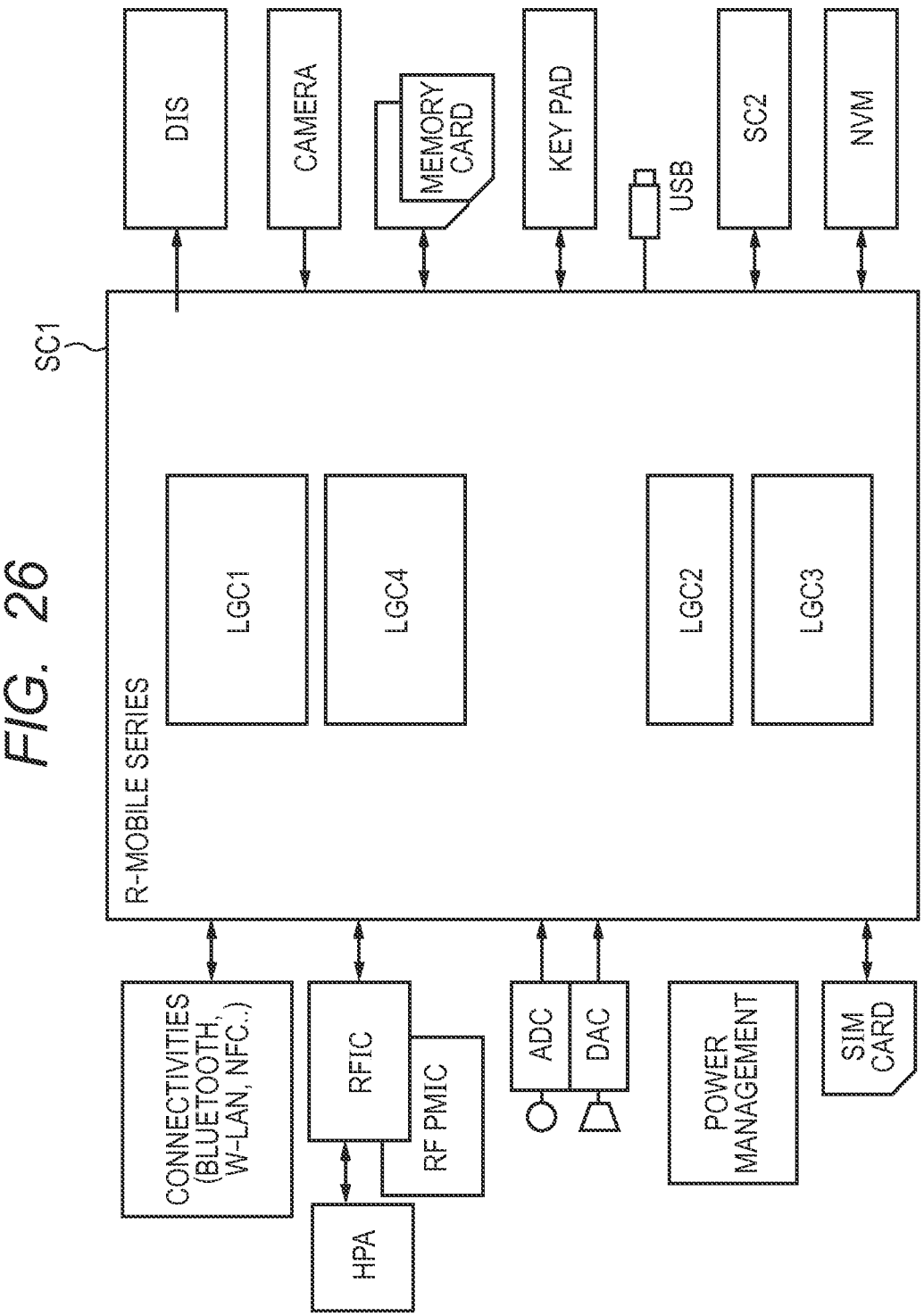
FIG. 26 is a block diagram showing the functional configuration of the electronic device.

FIG. 26 is a block diagram showing a functional configuration of the electronic device ED. In the example shown in FIG. 26, the second semiconductor chip SC2 is a memory chip. The first semiconductor chip SC1 uses the second semiconductor chip SC2 to control the electronic device ED. The first circuit formation area LGC1 of the first semiconductor chip SC1 is a core CPU (Central Processing Unit), and the second circuit formation area LGC2 of the first semiconductor chip SC1 is a GPU (Graphic Processing Unit). The first semiconductor chip SC1 further includes a plurality of circuitry areas LGC3, LGC4 (e.g., a modem circuit, speech processing circuit, etc.). The electronic device ED also includes a nonvolatile memory (NVM).

The first semiconductor chip SC1 communicates with a communication unit (either wired or wireless), a communication interface for wireless tag, such as RFIC, an analog-to-digital converter, a digital-to-analog converter, a power controller, an SIM card, an image pickup unit, a memory card, a user input unit (e.g., keypad), a USB communication unit, and an NVM.

It should be further understood by those skilled in the art that although the foregoing description has been made on embodiments of the invention, the invention is not limited thereto and various changes and modifications may be made without departing from the spirit of the invention and the scope of the appended claims.

The above-described second embodiment and the modifications thereof disclose the following invention.

(Supplementary Note 1)

A semiconductor device includes a wiring board, a first semiconductor chip that is mounted over a first surface of the wiring board and is rectangular in plan, a second semiconductor chip that is disposed over the first semiconductor chip, wherein at least a part of the second semiconductor chip extends out further than the first semiconductor chip in plan view, a metal plate is provided between the extending part of the second semiconductor chip further than the first semiconductor chip and the wiring board, and a part of the metal plate extends out further than the second semiconductor chip in plan view.

(Supplementary Note 2)

The semiconductor device recited in supplementary note 1 further includes sealing resin that is provided over the first surface of the wiring board to seal the first semiconductor chip and the second semiconductor chip, wherein the metal plate is exposed from side surfaces of the sealing resin.

What is claimed is:

1. A semiconductor device comprising:
a wiring board;
a first semiconductor chip that is mounted over a first surface of the wiring board and is rectangular in plan; and
a second semiconductor chip disposed over the first semiconductor chip,
wherein the first semiconductor chip has an element formation surface facing the first surface and has a plurality of first through-silicon vias, wherein the second semiconductor chip is electrically coupled to the first through-silicon vias of the first semiconductor chip, wherein, where a direction in parallel with a long side of the first semiconductor chip is defined as a row direction and a direction perpendicular to the long side of the first semiconductor chip is defined as a column direction, each one of the first through-silicon vias is arranged on any one of grid points arranged in m rows and n columns (m>n), and wherein, as viewed in a cross section taken along a short side of the first semiconductor chip, the center of a through-silicon via area, which is defined by coupling the outermost grid points arranged in m rows and n columns, is off center of the short side of the first semiconductor chip in a first direction.

2. The semiconductor device according to claim 1, wherein the second semiconductor chip has a plurality of a second through-silicon vias, and wherein a third semiconductor chip is disposed over the second semiconductor chip and is electically coupled to the second through-silicon vias of the second semiconductor chip.

3. The semiconductor device according to claim 2, wherein, as viewed in plan view, at least some of the second through-silicon vias overlap with any of the first through-silicon vias.

4. The semiconductor device according to claim 1, wherein in a cross section taken along the short side of the first semiconductor chip, the center of the first semiconductor chip is not aligned with the center of the second semiconductor chip.

5. The semiconductor device according to claim 1, wherein the first semiconductor chip includes a plurality of connection terminals that are provided over the element formation surface and coupled to the wiring board, wherein the first semiconductor chip includes a circuit formation area where a circuit is formed, and wherein at least some of the connection terminals are positioned between the through-silicon via area and the circuit formation area in plan view.

6. The semiconductor device according to claim 1, wherein the first semiconductor chip includes a plurality of connection terminals that are provided over the element formation surface, arranged along the short side of the first semiconductor chip, and coupled to the wiring board, and wherein in a direction in parallel with the the long side of the first semiconductor chip, the number of the connection terminals per unit length in an area overlapping with the through-silicon via area is fewer than the number of the connection terminals per unit length in an area not overlapping with the through-silicon via area.

7. The semiconductor device according to claim 1, wherein the second semiconductor chip is a memory chip, wherein the first semiconductor chip includes a memory control circuit that controls the second semiconductor chip in an area overlapping with the first through-silicon vias and its surroundings in plan view.

8. The semiconductor device according to claim 1, wherein when the first semiconductor chip is divided by an area extended from the through-silicon via area in a direction in parallel with a long side of the through-silicon via area into a first area and a second area that is smaller than the first area, the first semiconductor chip has a first logic circuit, which communicates with the second semiconductor chip, in the first area.

9. The semiconductor device according to claim 1, wherein, as viewed in plan view, the second semiconductor chip extends out further than the two long sides of the first semiconductor chip, and the extended amount of the second semiconductor chip extending from one of the long sides in the first direction is greater than the extended amount from the other long side, wherein the semiconductor device includes
first sealing resin that seals a space between the first semiconductor chip and the wiring board, and
second sealing resin that seals a space between the second semiconductor chip and the wiring board, and wherein, as viewed in plan view, the first sealing resin extends out further than the two long sides of the first semiconductor chip, and the extended amount of the first sealing resin extending from one of the long sides in the first direction is greater than the extended amount from the other long side.

10. The semiconductor device according to claim 1, wherein a length of a long side of the through-silicon via area are ten or more times longer than a length of a short side of the through-silicon via area.

11. The semiconductor device according to claim 1, wherein the first semiconductor chip includes the through-silicon via areas arranged in a direction along the short side of the first semiconductor chip, and wherein in a cross section taken along the short side of the first semiconductor chip, the centers of the respective through-silicon via areas are off center of the short side of the first semiconductor chip in the first direction.

12. The semiconductor device according to claim 1, wherein in a cross section taken along the short side of the first semiconductor chip, the center of the wiring board is aligned with the through-silicon via area.

13. The semiconductor device according to claim 1, wherein in a cross section taken along the short side of the first semiconductor chip, the center of the wiring board is aligned with the center of the second semiconductor chip.

* * * * *